(12) United States Patent
Yamano

(10) Patent No.: US 6,751,131 B2
(45) Date of Patent: Jun. 15, 2004

(54) SEMICONDUCTOR STORAGE DEVICE AND INFORMATION APPARATUS

(75) Inventor: Kaname Yamano, Ibaraki (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/308,835

(22) Filed: Dec. 2, 2002

(65) Prior Publication Data

US 2003/0112664 A1 Jun. 19, 2003

(30) Foreign Application Priority Data

Dec. 18, 2001 (JP) ........................................ 2001-385152

(51) Int. Cl.⁷ .............................................. G11C 16/04
(52) U.S. Cl. .............. 365/189.07; 365/210; 365/230.06
(58) Field of Search ........................... 365/189.07, 210, 365/230.03, 200, 233.5

(56) References Cited

U.S. PATENT DOCUMENTS 6,212,096 B1   4/2001   Pascucci

FOREIGN PATENT DOCUMENTS

JP   57203291   12/1982

*Primary Examiner*—David Lam
(74) *Attorney, Agent, or Firm*—Morrison & Foerster LLP

(57) ABSTRACT

A semiconductor storage device includes: a memory array including a plurality of memory cells; a reference array including a plurality of reference cells; a decoder section for selecting a memory cell from the memory cells and a reference cell from the reference cells based on address information; and a comparison/output section for comparing a read voltage level from the memory cell selected by the decoder section and a read voltage level from the reference cell selected by the decoder section so as to output a result of the comparison in the form of data, wherein the decoder section simultaneously outputs a selection signal to a word line of the memory cell and a selection signal to a word line of the reference cell.

14 Claims, 17 Drawing Sheets

Reference cell RC     Memory cell MC

FIG.17  CONVENTIONAL ART
(a)
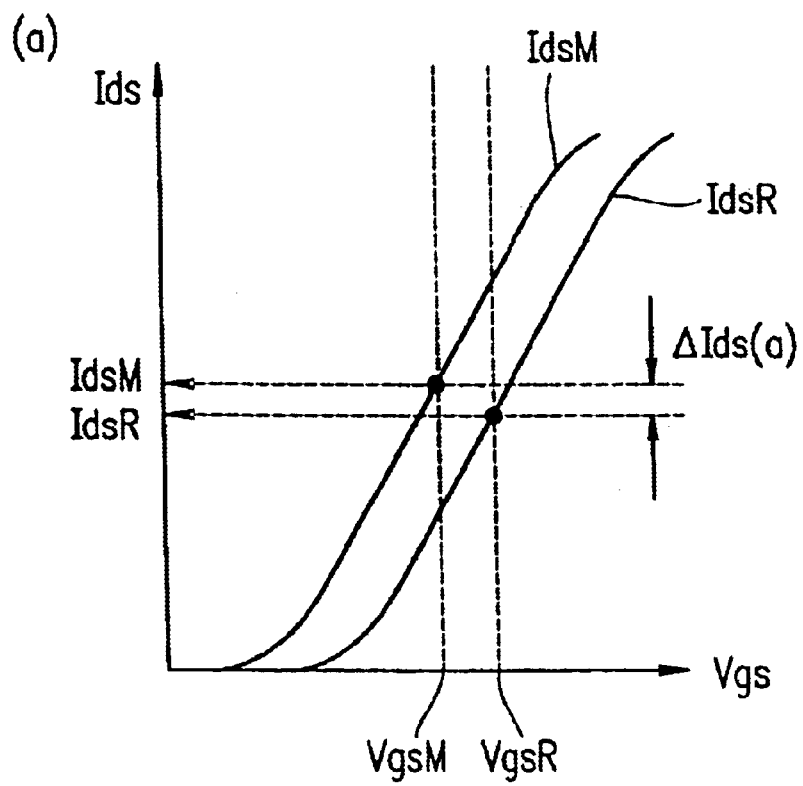
(b)
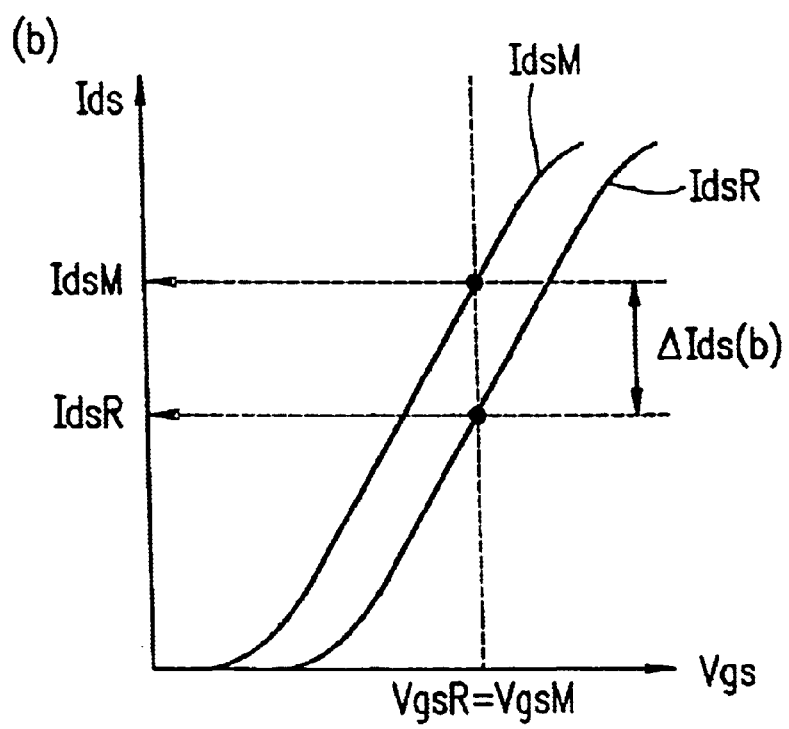

SEMICONDUCTOR STORAGE DEVICE AND INFORMATION APPARATUS

BACKGROUND OF THE INVENTION

1. Field of the Invention

The present invention relates to a non-volatile memory in which data is electrically rewritable, e.g., a semiconductor storage device such as a flash EEPROM or the like, and to an information device using the non-volatile memory, such as a cellular phone terminal or the like.

2. Description of the Related Art

Conventionally, in a non-volatile semiconductor storage device (a non-volatile memory) in which data is electrically rewritable, e.g., a flash EEPROM, a data read operation is performed as follows: as shown in FIG. 8, the same drain voltage is applied to a memory cell RC0 set at a predetermined threshold value, which is called a "reference cell", and to a memory cell MC0 of a memory array on which a data read operation is performed, while the same gate voltage is applied by a reference word line decoder and a normal word line decoder, and a difference between the values of currents flowing through the memory cells RC0 and MC0 is amplified by a sense amplifier S/A, and the result of the amplification is read out as stored data.

In a conventional method for applying a gate voltage to a reference cell RC0, a gate voltage is constantly applied to the reference cell RC0 while the supply voltage is supplied to the storage device (see FIGS. 9 through 11). In another conventional method, a gate voltage is applied to the reference cell RC0 according to an ATD signal which is activated during the data read operation (see FIGS. 12 through 14). Each of these methods will be specifically described below.

FIG. 9 is a block diagram showing an exemplary structure of a primary part of a conventional non-volatile semiconductor storage device 10. FIG. 9 illustrates a method wherein a voltage is constantly applied to each of the word lines of reference cells RC0, RC1 and RC2 while the supply voltage is supplied to the storage device.

In FIG. 9, the conventional non-volatile semiconductor storage device 10 includes: a memory cell array RA formed by a plurality of reference cells RC0–RC2 (hereinafter, referred to as "reference array RA"): level shifters LS0 and LS1, which form a word line control circuit for controlling the word lines of the reference cells; a memory cell array MA (hereinafter, referred to as "memory array MA"), which is a data storage region; a normal word line predecoder XPDEC; a normal word line decoder XDEC; a redundant word line predecoder XPRDEC; and a redundant word line decoder XRDEC.

The reference array RA includes: the reference cell RC0 used in a data read operation; the reference cell RC1 used for verifying deletion of data; and the reference cell RC2 used for verification in a data write operation. A reference cell word line RWL0 is connected to the gates of the reference cells RC0 and RC1, and a reference cell word line RWL1 is connected to the gate of the reference cell RC2. A bit line RBL0 is connected to the drain of the reference cell RC0; a bit line RBL1 is connected to the drain of the reference cell RC1; and a bit line RBL2 is connected to the drain of the reference cell RC2. The sources of the reference cells RC0–RC2 are all connected to a common source line RHS.

The level shifters LS0 and LS1 are powered by a node voltage HWL for word lines. The level shifter LS0 receives a reference cell selection signal SEL0, and outputs a voltage based on the received reference cell selection signal SEL0 to the reference cell word line RWL0, thereby selecting the word line RWL0. The level shifter LS1 receives a reference cell selection signal SEL1, and outputs a voltage based on the received reference cell selection signal SEL1 to the reference cell word line RWL1, thereby selecting the word line RWL1. The reference cell selection signals SEL0 and SEL1 are exclusively activated, such that one of the signals SEL0 and SEL1 is ON (e.g., when the supply voltage VCC is supplied to the storage device 10) while the other is OFF. For example, when the reference cell selection signal SEL0 is ON, the potential of the reference cell word line RWL0 rises, whereby the reference cell word line RWL0 is selected. When the reference cell selection signal SEL1 is ON, the potential of the reference cell word line RWL1 rises, whereby the reference cell word line RWL1 is selected.

The memory array MA includes a plurality of memory cells as memory elements arranged in a matrix along row and column directions. Herein, the description is simplified by referring only to memory cells MC0 and MC1 of the memory array MA. A memory array normal word line MWL is connected to the gate of the memory cell MC0, and a memory array redundant word line ReWL is connected to the gate of the memory cell MC1. A common bit line MBL is connected to each of the drains of the memory cells MC0 and MC1, and a source line MHS is connected to each of the sources of the memory cells MC0 and MC1. The source lines RHS and MHS are generally kept at the ground level, but controlled to be at a different level when the storage device is in a special mode, such as a test mode or the like. For example, in a deletion mode, the source lines RHS and MHS are at a high voltage level.

A redundancy determination signal MD, an address signal ADD and a word line enabling ATD signal SPW are input to the normal word line predecoder XPDEC. Based on these signals, the normal word line predecoder XPDEC outputs a normal word line selection signal SX to the normal word line decoder XDEC.

The normal word line decoder XDEC is powered by the node voltage HWL for word lines. Further, the normal word line decoder XDEC receives a normal word line selection signal SX which is output from the normal word line predecoder XPDEC, and outputs a voltage to a predetermined memory array normal word line MWL according to the normal word line selection signal SX, thereby selecting the predetermined memory array normal word line MWL.

The redundant word line predecoder XPRDEC receives the address signal ADD, the word line enabling ATD signal SPW, and a redundant word line address signal BADD. According to these signals, the redundant word line predecoder XPRDEC outputs a redundancy determination signal MD to the normal word line predecoder XPDEC, and a redundant word line selection signal RX to the redundant word line decoder XRDEC.

The redundant word line decoder XRDEC is powered by the node voltage HWL for word lines. Further, the redundant word line decoder XRDEC receives a redundant word line selection signal RX which is output from the redundant word line predecoder XPRDEC, and outputs a voltage to a predetermined memory array redundant word line ReWL according to the redundant word line selection signal RX, thereby selecting the predetermined memory array redundant word line ReWL.

A word line selection operation is now described with reference to the timing chart of FIG. 10, which is performed by a word line control circuit for the reference cells, a normal word line control circuit for the memory array, and a redundant word line control circuit for the memory array when a non-redundant memory array normal word line is selected.

FIG. 10 shows, from the top to the bottom of FIG. 10, supply voltage VCC; the node voltage HWL for word lines; a chip enabling signal CE# which is a control signal for activating the storage device 10; an output enabling signal OE# which is a control signal for permitting data output; the word line enable ATD signal SPW which is output from an address transition detection circuit (not shown); the potential of the reference cell word line RWL0; the normal word line selection signal SX; the potential of the memory array normal word line MWL; and the potential of the memory array redundant word line ReWL. When both the chip enabling signal CE# and the output enabling signal OE# are at the ground level, a data read operation can be performed. The chip enabling signal CE# and the output enabling signal OE# are control signals generally employed in a semiconductor memory, and therefore are omitted from the block diagram of FIG. 9.

In a memory in which data is electrically rewritable, e.g., the non-volatile semiconductor storage device 10 (such as a flash EEPROM), data can be read out unless a data write command or data deletion command is issued immediately after the supply voltage is started to be applied. That is, the chip enabling signal CE# for activating the semiconductor chip and the output enabling signal OE# for permitting data output from an output pad are decreased to the ground level, whereby information stored in the memory cell MC0 can be read out.

Referring to FIG. 10, after the storage device 10 is powered on at time t0, the supply voltage VCC begins to rise. Thereafter, at time t1, the node voltage HWL for word lines, which is used for reading of data, begins to rise.

At this time, for the reference cell RC0, the reference cell selection signal SEL0 is ON while the reference cell selection signal SEL1 is OFF (ground level), the word line RWL0 of the reference cell RC0 is charged through the level shifter LS0 with the node voltage HWL for word lines (about DC 5 V). Furthermore, the bit line RBL0 is selected, and the common source line RHS of the reference cell RC0 is controlled so as to be at the ground level. This voltage-controlled state occurs when a read command is issued.

At time t2 which occurs immediately after the storage device 10 is powered on with supply voltage VCC, the storage device 10 is in a data readable state. That is, in this state, data can be read out from the storage device 10 by decreasing the chip enabling signal CE# and the output enabling signal OE# to the ground level.

Then, at time t3, the word line enable ATD signal SPW rises in response to the chip enabling signal CE# reaching the ground level. At time t4, the normal word line selection signal SX rises to the supply voltage level.

At time t5, the potential of the predetermined memory array normal word line MWL rises in response to the rising of the normal word line selection signal SX. Note that since the memory array redundant word line ReWL is not selected in this example, the potential of the memory array redundant word line ReWL remains at the ground level.

After a while, reading of data is completed, and the word line enable ATD signal SPW falls to the ground level at time t6. Accordingly, the potential of the predetermined memory array normal word line MWL falls to the ground level at time t7. During the above operations, the reference cell word line RWL0 of the reference cell RC0 always remains high.

Next, a word line selection operation is described with reference to the timing chart of FIG. 11, which is performed by a word line control circuit for reference cells, a normal word line control circuit for memory array, and a redundant word line control circuit for memory array when a redundant word line is selected. In FIG. 11, a redundancy determination signal MD and a redundant word line selection signal RX are considered in addition to the various signals described above, and a redundant word line is considered in place of the memory array normal word line MWL. The operation from time t0 through time t3 is totally the same as that described in FIG. 10, and therefore, the description thereof is herein omitted. The following description of the word line selection operation begins with time t4.

As shown in FIG. 11, after a while since the word line enable ATD signal SPW has risen, the normal word line selection signal SX rises to the supply voltage level at time t4, and accordingly, the potential of the memory array normal word line MWL begins to rise. However, immediately after that, a redundancy determination signal MD is issued, and the normal word line predecoder XPDEC receives the redundancy determination signal MD and lowers the normal word line selection signal SX back to the ground level. The normal word line decoder XDEC receives the lowered normal word line selection signal SX and lowers the potential of the memory array normal word line MWL back to the ground level.

Substantially at the same time as the potential of the memory array normal word line MWL being lowered back to the ground level (at time t5), the redundant word line selection signal RX output from the redundant word line predecoder XPRDEC reaches the supply voltage level. As a result, the potential of the memory array redundant word line ReWL rises in substitution for the memory array normal word line MWL.

In this example, the memory array normal word line MWL is switched to the memory array redundant word line ReWL after the potential of the memory array normal word line MWL begins to rise. This is because the normal word line predecoder XPDEC undesirably issues the normal word line selection signal SX while the redundant word line predecoder XPRDEC is considering whether the word lines should be switched, and accordingly, a certain length of time is required for canceling the normal word line selection signal SX by the redundancy determination signal MD.

After reading of data is completed, the word line enable ATD signal SPW falls to a low level (GND level) at time t6. Accordingly, the redundant word line selection signal RX falls at time t7, and as a result, the potential of the memory array redundant word line ReWL falls to the ground level.

FIG. 9 shows also the reference cell RC1 used for verifying deletion of data and the reference cell RC2 used for verification in a data write operation. These cells are now briefly described below.

When a data write operation in the memory array MA is performed, a verifying operation is performed for determining whether or not writing of data is normally performed. During the verifying operation, the reference cell selection signal SEL1 is ON (high level) whereas the reference cell selection signal SEL0 is OFF (low level). Meanwhile, the bit line RBL2 is selected so that the bit line RBL0 of the reference cell RC0 for reading data is unselected. As a result, the reference cell RC2 becomes accessible. On the other hand, the common source line RHS is at the ground level, and the node voltage HWL for word lines is increased to, e.g., about 6 V, so as to perform a verifying operation.

In the case where a delete operation is performed on the memory array MA, a verifying operation is performed for determining whether or not the deletion operation has been normally completed. In this case, the reference cell selection signal SEL0 is ON (high level) whereas the reference cell selection signal SEL1 is OFF (low level). As a result, the bit line RBL1 is selected so that the reference cell RC1 for verifying deletion of data becomes accessible. On the other hand, the common source line RHS is at the ground level as in the write verifying operation, and the node voltage HWL for word lines is increased to, e.g., about 5 V, so as to perform a verifying operation.

FIG. 12 is a block diagram showing another exemplary structure of a primary part of a conventional non-volatile semiconductor storage device 11. FIG. 12 illustrates a method wherein a voltage is applied to a reference cell word line RWL of a reference cell RC according to the word line enable ATD signal SPW which is activated during a data read operation.

In FIG. 12, the conventional non-volatile semiconductor storage device 11 includes: a memory cell array RA including a reference cell RC (hereinafter, referred to as "reference array RA"); a reference word line control circuit CU; a memory cell array MA (hereinafter, referred to as "memory array MA"), which is a data storage region; a normal word line predecoder XPDEC; a normal word line decoder XDEC; a redundant word line predecoder XPRDEC; and a redundant word line decoder XRDEC. The arrangement of the memory array normal word line MWL, a circuit system for selectively controlling the memory array redundant word line ReWL, and the circuit structure of the memory array MA, and operations thereof, are the same as those in the non-volatile semiconductor storage device 10 shown in FIG. 9, and therefore, descriptions thereof are herein omitted.

The reference array RA includes the reference cell RC used for reading data. A reference cell word line RWL is connected to the gate of the reference cell RC; a bit line RBL is connected to the drain of the reference cell RC; and a source line RHS is connected to the source of the reference cell RC. The source line RHS is generally kept at the ground level, but controlled to be at a different level when the storage device is in a special mode, such as a test mode or the like. For example, in a deletion mode, the source line RHS is at a high voltage level. Herein, although only the reference cell RC for reading data is shown in FIG. 12, reference cells used for writing of data or a deletion verifying processing may be provided in other reference arrays, or may be provided in the reference array RA of FIG. 12 together with other reference word lines or the like. Herein, the description is focused on the reference cell RC for reading data, and descriptions about the reference cells used for writing of data or in a deletion verifying processing, and interconnections for controlling these reference cells and control circuits used therewith, are omitted.

The reference word line control circuit CU is powered with the node voltage HWL for word lines. The reference word line control circuit CU controls the potential of the reference cell word line RWL. The reference word line control circuit CU receives the word line enable ATD signal SPW which is issued when data is read out and a test word line selection signal SD for selectively controlling the reference cell word line RWL in a forcible manner during the test mode. The reference word line control circuit CU outputs a voltage to a predetermined reference cell word line RWL based on the above signals, thereby selecting the predetermined reference cell word line RWL.

Now, a word line selection operation is described with reference to the timing chart of FIG. 13, which is performed by a word line control circuit for the reference cells, a normal word line control circuit for the memory array, and a redundant word line control circuit for the memory array when a non-redundant normal word line is selected.

As in FIG. 10, FIG. 13 shows, from the top to the bottom of FIG. 13, supply voltage VCC; the node voltage HWL for word lines; a chip enabling signal CE# which is an input control signal for enabling a read or write operation in the storage device 10 (the storage device 10 can be operated when the chip enabling signal CE# is at the ground level); an output enabling signal OE# (data can be read out when the output enabling signal OE# is at the ground level); the word line enable ATD signal SPW; the potential of the reference cell word line RWL; the normal word line selection signal SX; the potential of the memory array normal word line MWL; and the potential of the memory array redundant word line ReWL.

Referring to FIG. 13, after the storage device 11 is powered on at time t0, the supply voltage VCC begins to rise. Thereafter, at time t1, the node voltage HWL for word lines, which is used for reading of data, begins to rise.

At time t2, the non-volatile semiconductor storage device 11 (e.g., flash EEPROM or the like) is in a data readable state immediately after it is powered ON. That is, in this state, a data read operation can be carried out by decreasing the chip enabling signal CE# to the ground level.

Then, at time t3, the word line enable ATD signal SPW rises in response to the falling of the chip enabling signal CE#. In response to the rising of the word line enable ATD signal SPW, the reference cell word line RWL is charged with the node voltage HWL for word lines at time t4, and at the same time, the normal word line predecoder XPDEC issues the normal word line selection signal SX.

At time t5, the normal word line predecoder XDEC raises the potential of the memory array normal word line MWL according to an output of the normal word line selection signal SX. Note that the potential of the memory array normal word line MWL rises with a slight delay behind the rising of the reference cell word line RWL due to a decoding operation.

After a while, reading of data is completed, and the word line enable ATD signal SPW falls to the ground level at time t6. Accordingly, the reference cell word line RWL and the memory array normal word line MWL fall to the ground level at time t7.

Next, a word line selection operation is described with reference to the timing chart of FIG. 14, which is performed by a word line control circuit for the reference cells, a normal word line control circuit for the memory array, and a redundant word line control circuit for the memory array when a redundant word line is selected. In FIG. 14, a redundancy determination signal MD and a redundant word line selection signal RX are considered in addition to the various signals described above, and a redundant word line is considered in place of the memory array normal word line MWL. The operation from time t0 through time t3 is totally the same as that described in FIG. 13, and therefore, the description thereof is herein omitted. The following description of the word line selection operation begins with time t4.

As shown in FIG. 13, after a while since the word line enable ATD signal SPW has risen, the normal word line selection signal SX rises to the supply voltage level at time t4, and accordingly, the potential of the memory array normal word line MWL begins to rise. However, immediately after that, a redundancy determination signal MD is issued, and the normal word line selection signal SX decreases back to the ground level in response to the redundancy determination signal MD at time t5. Further, in response to the decrease of the normal word line selection signal SX to the ground level, the potential of the memory array normal word line MWL decreases back to the ground level.

Substantially at the same time as the decrease in the potential of the memory array normal word line MWL to the ground level (at time t5), the redundant word line selection signal RX rises to the supply voltage level. As a result, the potential of the memory array redundant word line ReWL rises in substitution for the memory array normal word line MWL. The reason why the memory array normal word line MWL slightly pulses between time t4 and time t5 is the same as that described in connection with the example illustrated in FIG. 11.

After reading of data is completed, the word line enable ATD signal SPW falls to a low level at time t6. Accordingly, the redundant word line selection signal RX and the potential of the reference cell word line RWL fall to the ground level at time t7, and as a result, the potential of the memory array redundant word line ReWL falls to the ground level.

The trend in the field of semiconductor storage devices in recent years indicates that the supply voltage level applied to a semiconductor storage device has been decreasing. However, on the other hand, an increase in the speed of reading of stored information from a memory cell has been demanded. For example, in the conventional non-volatile semiconductor storage device 11, reading of stored information (data) from the memory cell can be carried out as follows: the same voltage is applied to the reference cell RC and a memory cell MC0 from which data is to be read out, and a difference between the values of currents flowing through the memory cells RC and MC0 is sensed by a sense amplifier S/A, which is formed by a differential amplifier, whereby reading of data is achieved.

In such a case, a risk of erroneous reading of data can be avoided by starting a sensing operation after a word line of a reference array and a word line for a memory array reach a predetermined voltage. However, in many cases, a reduction in read access time cannot be achieved because of the latency required until the word line of the reference array and the word line for the memory array reach a desired voltage. Thus, in almost all of such cases, the sense amplifier S/A is activated so as to begin a sensing operation before both of the above word lines reach a desired voltage, whereby an increase in access speed is achieved.

However, in the conventional art of FIGS. 9 and 12, the potential of the reference cell word line RWL rises prior to the rising of the potential of the memory array normal word line MWL. This causes some problems, which will be described in detail below with reference to FIGS. 15 through 17.

In FIG. 15, the left part shows a reference cell RC of a non-volatile memory such as a flash memory, and the right part shows a memory cell MC of then on-volatile memory. As shown in FIG. 15, agate voltage VgsR, which is applied to the reference cell RC, is equivalent to a voltage output to a reference cell word line RWL0 of FIG. 9, and is also equivalent to a voltage output to a reference cell word line RWL of FIG. 12. A current IdsR flows between a drain and source of the reference cell RC. On the other hand, a gate voltage VgsM, which is applied to the memory cell MC, is equivalent to a voltage output to the memory array normal word line MWL or the memory array redundant word line ReWL of FIGS. 9 and 12. A current IdsM flows between a drain and source of the reference cell MC.

FIG. 16 shows a graph of the voltage levels VgsR and VgsM of the word lines during reading of data from the memory cells RC and MC, where the horizontal axis represents time t, and the vertical axis represents voltage level V. In this graph, t(a) represents the time when a sensing operation starts (hereinafter, "sensing start time"), and t(b) represents the time when both the voltage level of the reference cell word line RWL of the memory cell RC and the voltage level of the memory array normal word line MWL of the memory cell MC (or the memory array redundant word line ReWL) reach a predetermined voltage level. At sensing start time t(a), the voltage level VgsR of the word line of the reference cell RC is at the predetermined voltage level in either of the examples of FIGS. 9 and 12.

Part (a) of FIG. 17 shows the relationships between the gate voltages Vgs applied to the gate electrodes of the reference cell RC and the memory cell MC (horizontal axis) and the currents Ids which flow between the source and drain of the cells RC and MC (vertical axis), respectively, at time t(a) of FIG. 16, i.e., before the potential of the memory array normal word line MWL or the memory array redundant word line ReWL which was set in FIG. 16 reaches the predetermined voltage.

Part (b) of FIG. 17 shows the relationships between the gate voltages Vgs (horizontal axis) and the currents Ids which flow between the source and drain of the cells RC and MC (vertical axis), respectively, at time t(b) of FIG. 16, i.e., after the potential of the memory array normal word line MWL or the memory array redundant word line ReWL which was set in FIG. 16 has reached the predetermined voltage.

In the case where the amount of a current flowing through the memory cell MC, from which data is read out, is larger than that flowing through the reference cell RC, i.e., in the case where the threshold of the memory cell MC is lower than that of the reference cell RC, reading of data from the memory cell MC is adversely affected. This case is described below.

Immediately after the sensing start time t(a) shown in FIG. 16, the voltage VgsR of the reference cell word line RWL which is applied to the reference cell RC is generally at the predetermined voltage. However, on the other hand, the gate voltage VgsM of the memory array normal word line MWL (or the memory array redundant word line ReWL) applied to the gate of the memory cell MC, from which data is to be read, is lower than the word line voltage VgsR applied to the reference cell RC (t(a); VgsR>VgsM). In this case, the difference ΔIds(a) between the current IdsR flowing through the reference cell RC and the current IdsM flowing through the memory cell MC becomes as small as possible as shown in part (a) of FIG. 17. Thus, there is a possibility that the difference cannot be correctly sensed by the sense amplifier S/A so that the storage device results in an erroneous operation, e.g., unintended data is read out.

On the other hand, at time t(b) shown in FIG. 16, both the word line voltage VgsR applied to the gate of the reference cell RC and the word line voltage VgsM applied to the gate of the memory cell MC, from which data is to be read, are at the same predetermined voltage (t(b); VgsR=VgsM). In this case, the difference ΔIds(b) between the current IdsR flowing through the reference cell RC and the current IdsM flowing through the memory cell MC is sufficiently large so that it can be correctly sensed by the sense amplifier S/A. As a result, intended data can be read out without causing an erroneous operation.

However, if unintended data is once output immediately after the sensing start time (time t(a)), in many cases, extra time is consumed until intended data is successfully output. This extra time is considerably long especially when a redundant word line is selected, because as described above, a certain length of time is required for switching from a normal word line to the redundant word line.

SUMMARY OF THE INVENTION

According to one aspect of the present invention, a semiconductor storage device includes: a memory array including a plurality of memory cells; a reference array including a plurality of reference cells; a decoder section for selecting a memory cell from the memory cells and a reference cell from the reference cells based on address information; and a comparison/output section for comparing a read voltage level from the memory cell selected by the decoder section and a read voltage level from the reference cell selected by the decoder section so as to output a result of the comparison in the form of data, wherein the decoder section simultaneously outputs a selection signal to a word line of the memory cell and a selection signal to a word line of the reference cell.

In one embodiment of the present invention, the memory array includes one or more memory cells respectively connected to a normal word line, and one or more memory cells respectively connected to a redundant word line; and the reference array includes a first reference cell which is compared with the memory cells connected to the normal word line, and a second reference cell which is compared with the memory cells connected to the redundant word line.

In another embodiment of the present invention, when the normal word line is selected, the decoder section selects a first word line connected to the first reference cell simultaneously with selection of the normal-word line; and when the redundant word line is selected, the decoder section selects a second word line connected to the second reference cell simultaneously with selection of the redundant word line.

In still another embodiment of the present invention, the decoder section includes: a selection determination section for determining which of the normal word line and the redundant word line is to be selected based on address information; a normal word line control section for selecting the normal word line according to the address information when it is determined that the normal word line is to be selected; a redundant word line control section for selecting the redundant word line according to the address information when it is determined that the redundant word line is to be selected: a first reference word line control section for selecting the first word line when it is determined that the normal word line is to be selected; and a second reference word line control section for selecting the second word line when it is determined that the redundant word line is to be selected.

In still another embodiment of the present invention, when it is determined that the normal word line is to be selected, the first reference word line control section receives a selection signal for the normal word line or a signal indicating that the normal word line is to be selected, and selects the first word line, using as a trigger, the selection signal for the normal word line or the signal indicating that the normal word line is to be selected; and when it is determined that the redundant word line is to be selected, the second reference word line control section receives a selection signal for the redundant word line or a signal indicating that the redundant word line is to be selected, and selects the second word line, using as a trigger, the selection signal for the redundant word line or the signal indicating that the redundant word line is to be selected.

In still another embodiment of the present invention, a first test signal can be input to the first reference word line control section, and the first reference cell is enforcedly selected in response to the first test signal; and a second test signal can be input to the second reference word line control section, and the second reference cell is enforcedly selected in response to the second test signal.

In still another embodiment of the present invention, an address transition detection signal, which is output in response to detection of a change in the address information, can be input to both the first reference word line control section and the second reference word line control section; and when the address transition detection signal is input, control of reference word lines can be performed.

In still another embodiment of the present invention, the first reference cell and the second reference cell are set to the same threshold value.

In still another embodiment of the present invention, the first reference cell and the second reference cell are commonly connected to the same bit line.

In still another embodiment of the present invention, the load capacitance of a first word line connected to the first reference cell and the load capacitance of a second word line connected to the second reference cell are equal to the load capacitance of the normal word line and the load capacitance of the redundant word line, respectively. Alternatively, the load capacitances of the first word line, the second word line, the normal word line and the redundant word line may be equal.

According to another aspect of the present invention, there is provided an information apparatus for performing a data read operation using one of the above semiconductor storage devices.

An operation of the above-described structure of the present invention is described below.

In the case of reading data from a desired memory cell, if a normal word line, which is not a redundant word line, is selected, the potential of the word line of a reference array rises simultaneously with and in synchronization with a selection signal for selecting the normal word line of the memory array. Alternatively, if the redundant word line is selected, the potential of the word line of a reference array likewise rises simultaneously with and in synchronization with a selection signal for selecting the redundant word line of the memory array.

Since the potential of the word line of the reference cell and the potential of the word line of the memory cell, from which data is to be read, rise simultaneously in synchronization with each other. Thus, in the case of reading data from the memory cell, it is not necessary to wait for both of the word lines reaching a predetermined voltage level. As a result, a read access time can be further shortened without causing an erroneous operation. Due to such an improvement of the data reading speed, a considerable sensing margin can be secured.

Further, the load capacitances of the first and second word lines of the reference array are identical to those of the normal word line and redundant word line of the memory array, respectively. Thus, the rising edges of the potentials of the word lines occur at the same time, and accordingly, a read access time can be further shortened without causing an erroneous operation.

Furthermore, a semiconductor storage device of the present invention can readily be applied to an information apparatus. Thus, in a data read operation, high-speed data reading can be achieved.

Thus, the invention described herein makes possible the advantages of providing (1) a semiconductor storage device wherein a read access time can be shortened without causing an erroneous operation, and (2) an information apparatus using such a semiconductor storage device.

These and other advantages of the present invention will become apparent to those skilled in the art upon reading and understanding the following detailed description with reference to the accompanying figures.

BRIEF DESCRIPTION OF THE DRAWINGS

FIG. 17 shows the currents flowing through a memory cell and a reference cell at time t(a) in FIG. 16 (part (a) of FIG. 17) and at time t(b) in FIG. 16 (part (b) of FIG. 17).

DESCRIPTION OF THE PREFERRED EMBODIMENTS

Hereinafter, embodiments of the present invention will be described with reference to the drawings. In an example described below, the present invention is applied to a non-volatile semiconductor device used in an information apparatus.

Figure 1:
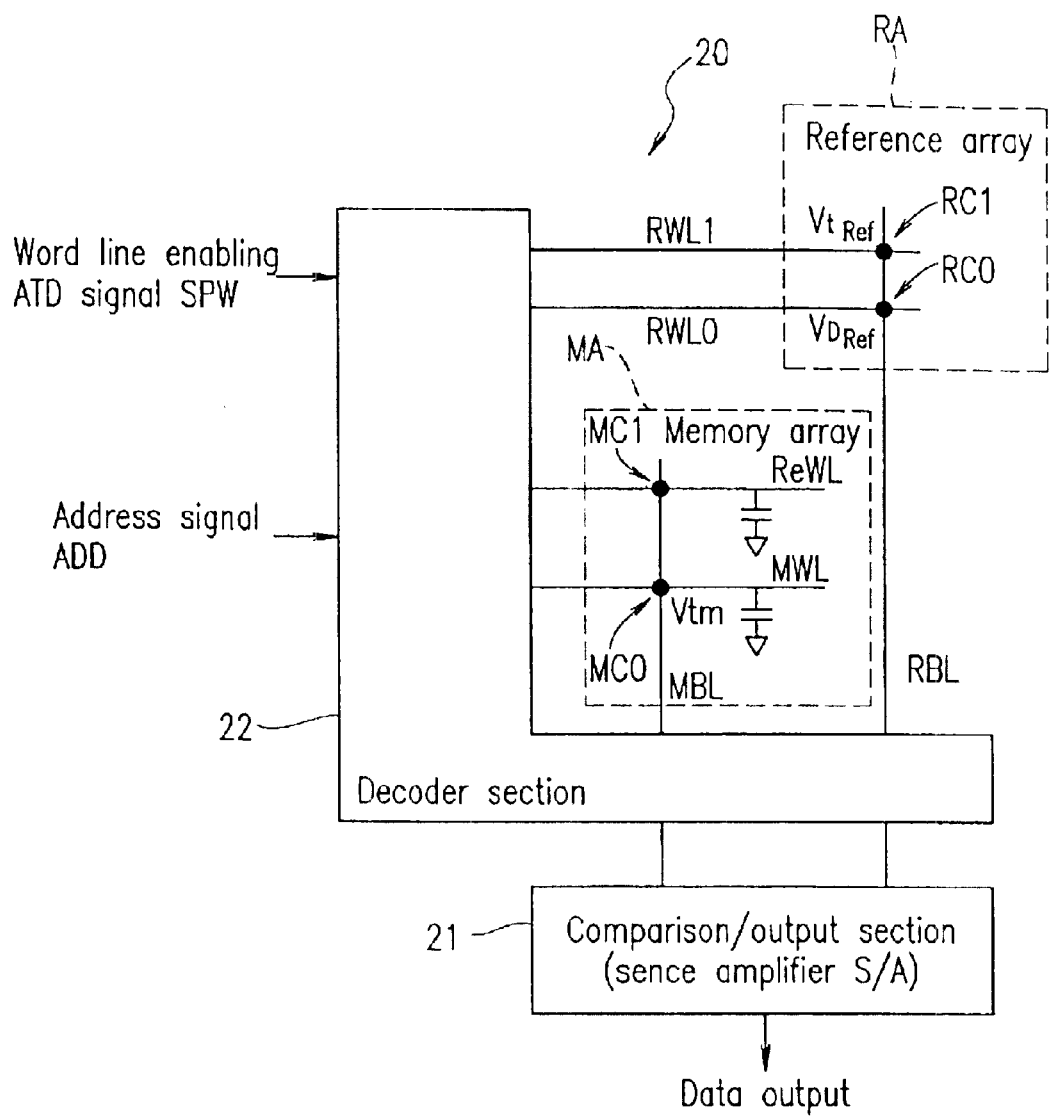
FIG. 1 is a block diagram showing an exemplary basic structure of a non-volatile semiconductor storage device according to an embodiment of the present invention.

FIG. 1 is a block diagram showing an exemplary basic structure of a non-volatile semiconductor storage device according to an embodiment of the present invention.

In FIG. 1, the non-volatile semiconductor storage device 20 includes: a memory cell array RA having a plurality of reference cells RC0 and RC1 (hereinafter, referred to as a "reference array RA"); a memory cell array MA (hereinafter, referred to as a "memory array MA") which is a data storage region and is a main array of the storage device 20; a comparison/output section 21, such as a sense amplifier S/A formed by a differential amplifier; and a decoder section 22 for selecting predetermined memory cell and reference cell based on an input address signal ADD.

In the reference array RA, at least two reference cell word lines used for reading data from the reference array RA, e.g., the word lines RWL0 and RWL1, are provided. The reference cell word line RWL0 and RWL1 are connected to reference cells RC0 and RC1, respectively. The reference cells RC0 and RC1 are commonly connected to the bit line RBL and have the same threshold value. The reference cell word line RWL0 is activated when a non-redundant memory array normal word line MWL (described later) of the memory array MA is selected, and the reference cell word line RWL1 is activated when a memory array redundant word line ReWL (described later) of the memory array MA is selected.

The memory array MA forms an information storage region and generally includes a plurality of memory cells MC as storage elements arranged in a matrix along the row and column directions. Herein, only a memory cell MC0 for data storage and a redundant memory cell MC1 which is provided for substituting the memory cell MC0 are illustrated for the simplicity of description. The memory array normal word line MWL is connected to the gate of the memory cell MC0, and the memory array redundant word line ReWL is connected to the gate of the memory cell MC1. The drains of the memory cells MC0 and MC1 are commonly connected to a bit line MBL.

The comparison/output section 21 compares the read voltage (or current) level of the memory cell MC0 (or MC1) selected by the decoder section 22 with the read voltage (or current) level of the reference cell RC0 (or RC1) selected by the decoder section 22, and outputs data which represents a result of the comparison. Specifically, the sense amplifier S/A, for example, applies the same gate voltage to both the memory cell MC0 (or MC1) and the reference cell RC0 (or RC1) selected by the decoder section 22, and amplifies a difference between the values of the electric currents flowing through the memory cell MC0 (or MC1) and the reference cell RC0 (or RC1), and outputs the result of amplification in the form of data.

In the case of selecting the memory array normal word line MWL, the decoder section 22 selects the reference cell word line RWL0 (first word line) connected to the reference cell RC0, together with the memory array normal word line MWL. In the case of selecting the memory array redundant word line ReWL, the decoder section 22 selects the reference cell word line RWL1 (second word line) connected to the reference cell RC1, together with the memory array redundant word line ReWL. That is, the decoder section 22 simultaneously and synchronously outputs selection signals to both the word lines MWL and RWL0 (or ReWL and RWL1) of the memory cell MC0 (or MC1) and the reference cell RC0 (or RC1) so as to raise the word line potentials, such that the timings of reading of data from the memory cell MC0 (or MC1) and the reference cell RC0 (or RC1) are concurrent and synchronous.

Thus, since the timings of reading of data from the memory cell MC0 (or MC1) and the reference cell RC0 (or RC1) are synchronized, it is not necessary for the reading of data from the memory cell MC0 (or MC1) to consume extra time until when both the potentials of the word lines MWL and RWL0 (or ReWL and RWL1) reach a predetermined voltage level, which is required in a conventional device. Further, a data read operation can be performed without causing an erroneous operation even when both the potentials of the word lines are rising, whereby the read access time is shortened.

A specific example of a non-volatile semiconductor storage device 20 according to the present invention is now described with reference to FIGS. 2 through 7.

Figure 2:
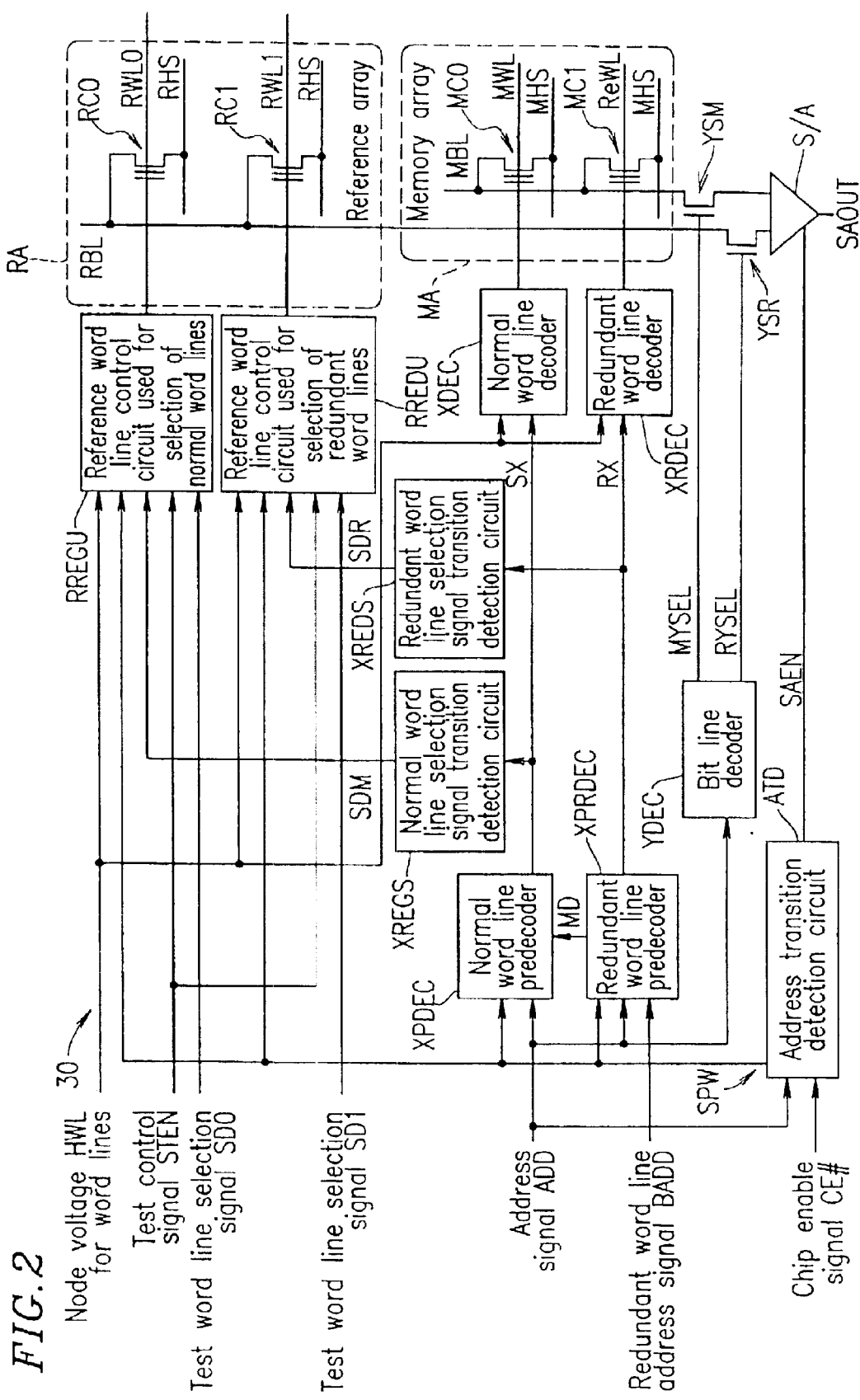
FIG. 2 is a block diagram showing an exemplary specific structure of the non-volatile semiconductor storage device of FIG. 1.

FIG. 2 is a block diagram showing an exemplary specific structure of the non-volatile semiconductor storage device 20 of FIG. 1.

In FIG. 2, a non-volatile semiconductor storage device 30, which is an exemplary specific structure of the non-volatile semiconductor storage device 20, includes: a reference array RA, a memory array MA, an address transition detection circuit ATD, a normal word line predecoder XPDEC, a normal word line decoder (normal word line control section) XDEC, a normal word line selection signal transition detection circuit XREGS, a redundant word line predecoder XPRDEC, a redundant word line decoder (redundant word line control section) XRDEC, a redundant word line selection signal transition detection circuit XREDS, a bit line decoder YDEC, switching sections YSM and YSR (hereinafter "bit line selection transistors YSM and YSR"), a sense amplifier S/A as the comparison/output section 21 (FIG. 1), a reference word line control circuit RREGU used for selection of normal word lines (first reference word line control section), and a reference word line control circuit RREDU used for selection of redundant word lines (second reference word line control section). The decoder section 22 of FIG. 1 is formed by the following elements shown in FIG. 2: the normal word line predecoder XPDEC, the normal word line decoder (normal word line control section) XDEC, the normal word line selection signal transition detection circuit XREGS, the redundant word line predecoder XPRDEC, the redundant word line decoder (redundant word line control section) XRDEC, the redundant word line selection signal transition detection circuit XREDS, the bit line decoder YDEC, the bit line selection transistors YSM and YSR, the reference word line control circuit RREGU used for selection of normal word lines, and the reference word line control circuit RREDU used for selection of redundant word lines.

In the reference array RA, a reference cell word line (first word line) RWL0 is connected to the gate of the reference cell (first reference cell) RC0, and a reference cell word line (second word line) RWL1 is connected to the gate of the reference cell (second reference cell) RC1. A bit line RBL is commonly connected to the drains of the reference cell RC0 and RC1, and a source line RHS is commonly connected to the sources of the reference cell RC0 and RC1.

In the memory array MA, a memory array normal word line MWL is connected to the gate of the memory cell MC0, and a memory array redundant word line ReWL is connected to the gate of the memory cell MC1. A bit line MBL is commonly connected to the drains of the memory cell MC0 and MC1, and a source line MHS is commonly connected to the sources of the memory cell MC0 and MC1. The source lines RHS and MHS are generally maintained at a ground level, but controlled to be at a different level when the storage device is in a special mode, such as a test mode or the like. For example, in a deletion mode, the source lines RHS and MHS are at a high voltage level.

The load capacitances of the reference cell word lines RWL0 and RWL1, the memory array normal word line MWL, and the memory array redundant word line ReWL are set to the same (or substantially the same) load capacitance such that the rising times of the potentials of these word lines becomes equal.

The address transition detection circuit ATD receives an address signal ADD and a chip enable signal CE#. The address transition detection circuit ATD has a plurality of address signal lines. When at least one of the address signal lines transitions (i.e., when the address signal ADD is input), or when the chip enable signal CE# decreases to the ground level, a required pulse signal, e.g., a word line enable ATD signal SPW, which is also an address transition detection signal, is output to the normal word line predecoder XPDEC, the redundant word line predecoder XPRDEC, the reference word line control circuit RREGU used for selection of normal word lines, and the reference word line control circuit RREDU used for selection of redundant word lines. Further, the address transition detection circuit ATD outputs a sense amplifier enable signal SAEN, as another required pulse signal, to the sense amplifier S/A.

The normal word line predecoder XPDEC receives the address signal ADD and the word line enable ATD signal SPW as well as a redundancy determination signal MD. When the normal word line predecoder XPDEC receives the word line enable ATD signal SPW but does not receive the redundancy determination signal MD, the normal word line predecoder XPDEC outputs a normal word line selection signal SX based on the received address signal ADD to the normal word line decoder XDEC and the normal word line selection signal transition detection circuit XREGS.

The normal word line decoder XDEC is powered by a node voltage HWL for word lines. The normal word line decoder XDEC receives the normal word line selection signal SX from the normal word line predecoder XPDEC, and outputs a voltage to a predetermined memory array normal word line MWL (raises the potential of the word line MWL) according to the normal word line selection signal SX, thereby selecting the predetermined memory array normal word line MWL.

The redundant word line predecoder XPRDEC receives the address signal ADD, the word line enabling ATD signal SPW, and a redundant word line address signal BADD. The redundant word line predecoder XPRDEC performs redundancy determination based on the address signal ADD, and outputs a redundancy determination signal MD to the normal word line predecoder XPDEC, and a redundant word line selection signal RX to the redundant word line decoder XRDEC and the redundant word line selection signal transition detection circuit XREDS.

The redundant word line predecoder XPRDEC and the normal word line predecoder XPDEC forms a selection determination section. The selection determination section determines based on the address signal ADD which of the predetermined memory array normal word line MWL and the memory array redundant word line ReWL is to be selected. For example, according to this embodiment, the redundant word line predecoder XPRDEC determines based on the address signal ADD whether or not a memory array normal word line MWL selected based on the normal word line selection signal SX from the normal word line predecoder XPDEC needs to be replaced with the predetermined memory array redundant word line ReWL, and only when such replacement is necessary, the redundant word line predecoder XPRDEC issues a redundancy determination signal MD to the normal word line predecoder XPDEC. In response to the redundancy determination signal MD from the redundant word line predecoder XPRDEC, the normal word line predecoder XPDEC cancels the output of the normal word line selection signal SX. On the other hand, the redundant word line predecoder XPRDEC outputs a redundant word line selection signal RX for selecting the memory array redundant word line ReWL.

The redundant word line decoder XRDEC is powered by the node voltage HWL for word lines. Further, the redundant word line decoder XRDEC receives a redundant word line selection signal RX from the redundant word line predecoder XPRDEC, and outputs a voltage to a predetermined memory array redundant word line ReWL (raises the potential of the word line ReWL) according to the redundant word line selection signal RX, thereby selecting the predetermined memory array redundant word line ReWL.

One output terminal of the bit line decoder YDEC is connected to a bit line selection gate line RYSEL for reference array. The bit line selection gate line RYSEL is connected to a gate electrode of the bit line selection transistor YSR. The other output terminal of the bit line decoder YDEC is connected to a bit line selection gate line MYSEL for memory array. The bit line selection gate line MYSEL is connected to a gate electrode of the bit line selection transistor YSM. The bit line decoder YDEC performs a decode operation for selecting any reference array bit line RBL and any memory array bit line MBL based on the input address signal ADD.

The bit line selection transistors YSR and YSM select, based on a selection signal from the bit line decoder YDEC, any of a plurality of bit lines RBL in the reference array RA and any of a plurality of bit lines MBL in the memory array MA, whereby connecting the selected bit lines RBL and MBL respectively to the input terminals of the sense amplifier S/A. That is, the bit line selection transistor YSR connects an end of any of the bit lines RBL of the reference array RA to one of the input terminals of the sense amplifier S/A. The bit line selection transistor YSM connects an end of any of the bit lines MBL of the memory array MA to the other input terminal of the sense amplifier S/A.

The sense amplifier S/A is activated in response to receipt of the sense amplifier enable signal SAEN from the address transition detection circuit ATD, and outputs a result of a sensing operation through a line SAOUT. That is, the sense amplifier S/A amplifies a difference between the values of the electric currents flowing through the memory cell MC0 (or MC1) and the reference cell RC0 (or RC1), and outputs the result of amplification in the form of data.

The reference word line control circuit RREGU used for selection of normal word lines receives: the node voltage HWL for word lines: the word line enabling ATD signal SPW; a test control signal STEN; a normal word line selection control signal SDM for controlling the memory array normal word line MWL of the memory array MA; and a test word line selection signal SD0, which is an enforced selection signal used in a test. The reference word line control circuit RREGU, which will be described later in detail with reference to FIGS. 3 and 4, raises the potential of the reference cell word line RWL0 based on the normal word line selection control signal SDM which is input when a non-redundant memory array normal word line MWL of the memory array MA is selected, so as to select the reference cell word line RWL0.

The reference word line control circuit RREDU used for selection of redundant word lines receives: the node voltage HWL for word lines; the word line enabling ATD signal SPW; the test control signal STEN; a redundant word line selection control signal SDR for controlling the memory array redundant word line ReWL of the memory array MA; and a test word line selection signal SD1, which is another enforced selection signal used in a test. The reference word line control circuit RREDU, which will be described later in detail with reference to FIGS. 3 and 4, raises the potential of the reference cell word line RWL1 based on the redundant word line selection control signal SDR which is input when the memory array redundant word line ReWL of the memory array MA is selected, so as to select the reference cell word line RWL1.

Specific structures of the reference word line control circuit RREGU used for selection of normal word lines and the reference word line control circuit RREDU used for selection of redundant word lines are described below. Further, a method for selecting a reference word line in a data read operation and in a test operation according to the present invention is also described.

Figure 3:
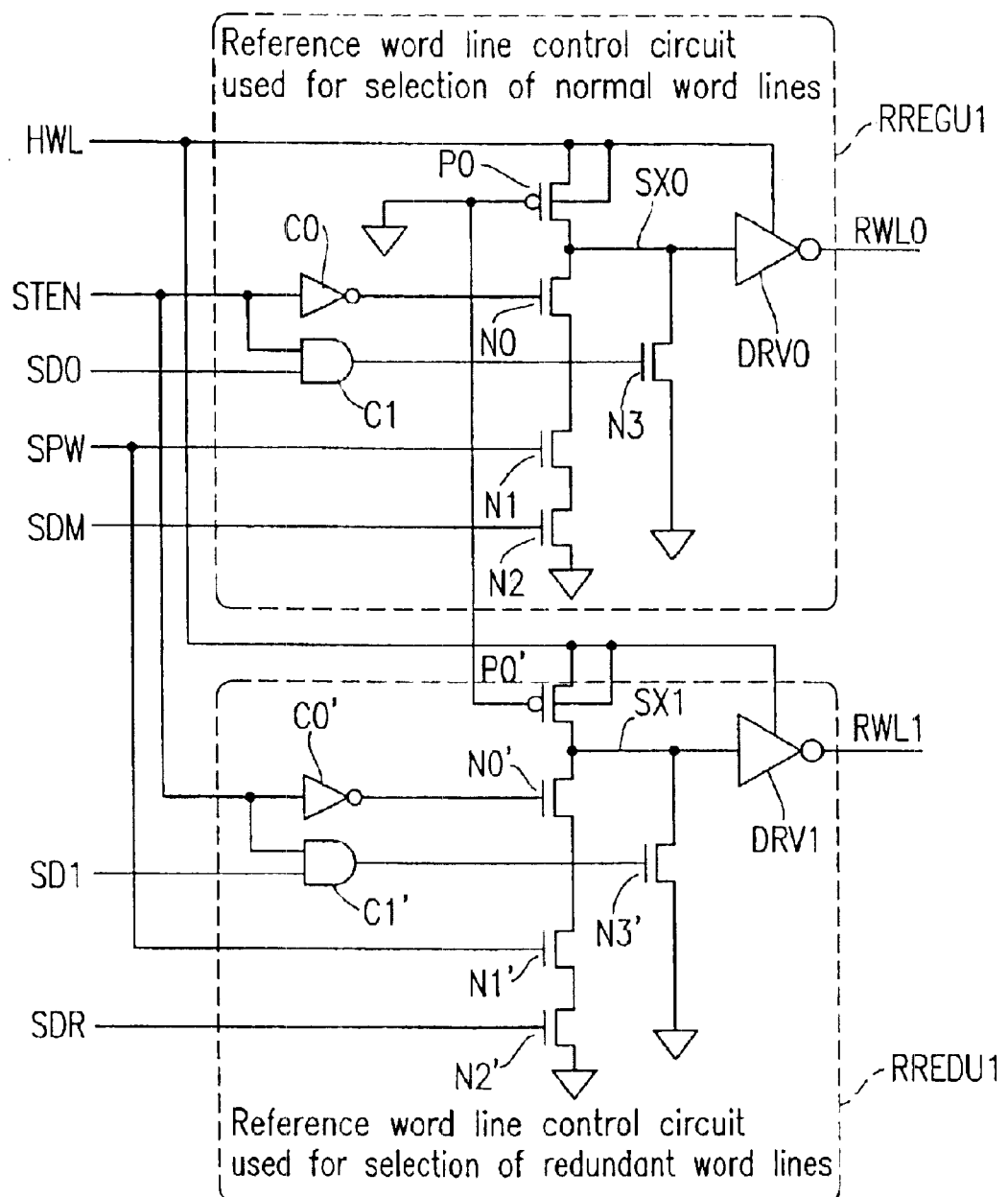
FIG. 3 is a circuit diagram showing a specific example of the reference word line control circuit used for selection of normal word lines and the reference word line control circuit used for selection of redundant word lines of FIG. 2.

FIG. 3 is a circuit diagram showing a specific example (inverter-type word line driver) of the reference word line control circuit RREGU and the reference word line control circuit RREDU of FIG. 2.

In FIG. 3, the upper part in the broken line box represents the reference word line control circuit RREGU1 used for selection of normal word lines, and the lower part in the broken line box represents the reference word line control circuit RREDU1 used for selection of redundant word lines.

The reference word line control circuit RREGU1 used for selection of normal word lines is formed by an inverter C0, an AND logical circuit C1, a P-type transistor P0, N-type transistors N0–N3, and a word line drive inverter DRV0.

As in the reference word line control circuit RREGU1, the reference word line control circuit RREDU1 used for selection of redundant word lines is formed by an inverter C0', an AND logical circuit C1', a P-type transistor P0', N-type transistors N0'–N3', and a word line drive inverter DRV1.

The resistance of the P-type transistor P0 (or P0') is set to a very high resistance value. When all of the N-type transistors N0–N2 (or N0'–N2') which are serially connected to the drain side of the P-type transistor P0 (or P0') are ON, or when only the N-type transistor N3 (or N3') is ON, an input node SX0 (or SX1) of the word line drive inverter DRV0 (or DRV1) is decreased to the ground level, and the potential of the reference cell word line RWL0 (or RWL1) rises. Note that reference marks in parentheses denote elements used when the reference word line control circuit RREDU1 used for selection of redundant word lines is activated.

Each of the reference word line control circuit RREGU1 used for selection of normal word lines and the reference word line control circuit RREDU1 used for selection of redundant word lines receives the node voltage HWL for word lines, the test control signal STEN, and the word line enabling ATD signal SPW. The reference word line control circuit RREGU1 used for selection of normal word lines further receives the test word line selection signal (first test signal) SD0 and the normal word line selection control signal SDM. The reference word line control circuit RREDU1 used for selection of redundant word lines further receives the test word line selection signal (second test signal) SD1 and the redundant word line selection control signal SDR.

In the above structure, the test control signal STEN is zero (low level) when data is read from a memory cell. Due to the AND logical circuit C1 (or C1), the N-type transistor N3 (or N3') is OFF regardless of the output state of the test reference word line selection signal SD0 (or SD1). On the other hand, the N-type transistors N0 and N0' are ON due to the operation of the inverters C0 and C0'. The word line enabling ATD signal SPW is at a high level (supply voltage level) when data is read from a memory cell, and therefore, both the N-type transistors N1 and N1' are ON.

When the memory array normal word line MWL is selected, the normal word line selection control signal SDM is at high level, and therefore, the N-type transistor N2 is ON. Thus, when all of the N-type transistors N0–N2 are ON, the node SX0 is decreased to the ground level, and a selection signal is output from the word line drive inverter DRV0 to the reference cell word line RWL0, whereby the potential of the reference cell word line RWL0 rises.

Alternatively, when the memory array redundant word line ReWL is selected, the redundant word line selection control signal SDR is at high level, and therefore, the N-type transistor N2' is ON. Thus, when all of the N-type transistors N0'–N2' are ON, the node SX1 is decreased to the ground level, and a selection signal is output from the word line drive inverter DRV1 to the reference cell word line RWL1, whereby the potential of the reference cell word line RWL1 rises.

In a test mode, i.e., in the case where a reference cell is manually and enforcedly accessed, the test control signal STEN is 1 (high level). Thus, the N-type transistors N0 and N0' are OFF due to the operation of the inverters C0 and C0'. Therefore, control cannot be exerted over reading of data regardless of the states of the word line enabling ATD signal SPW, the normal word line selection control signal SDM, and the redundant word line selection control signal SDR.

In the test mode, the test reference word line selection signals SD0 and SD1 transition according to the input address signal ADD. When the test reference word line selection signal SD0 is 1, the N-type transistor N3 is turned ON so that the node SX0 is decreased to the ground level. Accordingly, a selection signal is output from the word line drive inverter DRV0 to the reference cell word line RWL0, whereby the potential of the reference cell word line RWL0 rises. Alternatively, when the test reference word line selection signal SD1 is 1, the N-type transistor N3' is turned ON so that the node SX1 is decreased to the ground level. Accordingly, a selection signal is output from the word line drive inverter DRV1 to the reference cell word line RWL1, whereby the potential of the reference cell word line RWL1 rises.

In the above circuit example illustrated in FIG. 3, the word line driver is an inverter-type driver where the P-type transistors P0 and P0' are used as high-resistance elements, but the present invention is not limited thereto. The present invention can be implemented with a different type of word line driver. For example, a latch-type word line driver of FIG. 4, which is different from the inverter-type word line driver of FIG. 3, may be employed. Control of reference word line decoding with such a latch-type word line driver will be described below with reference to FIG. 4.

Figure 4:
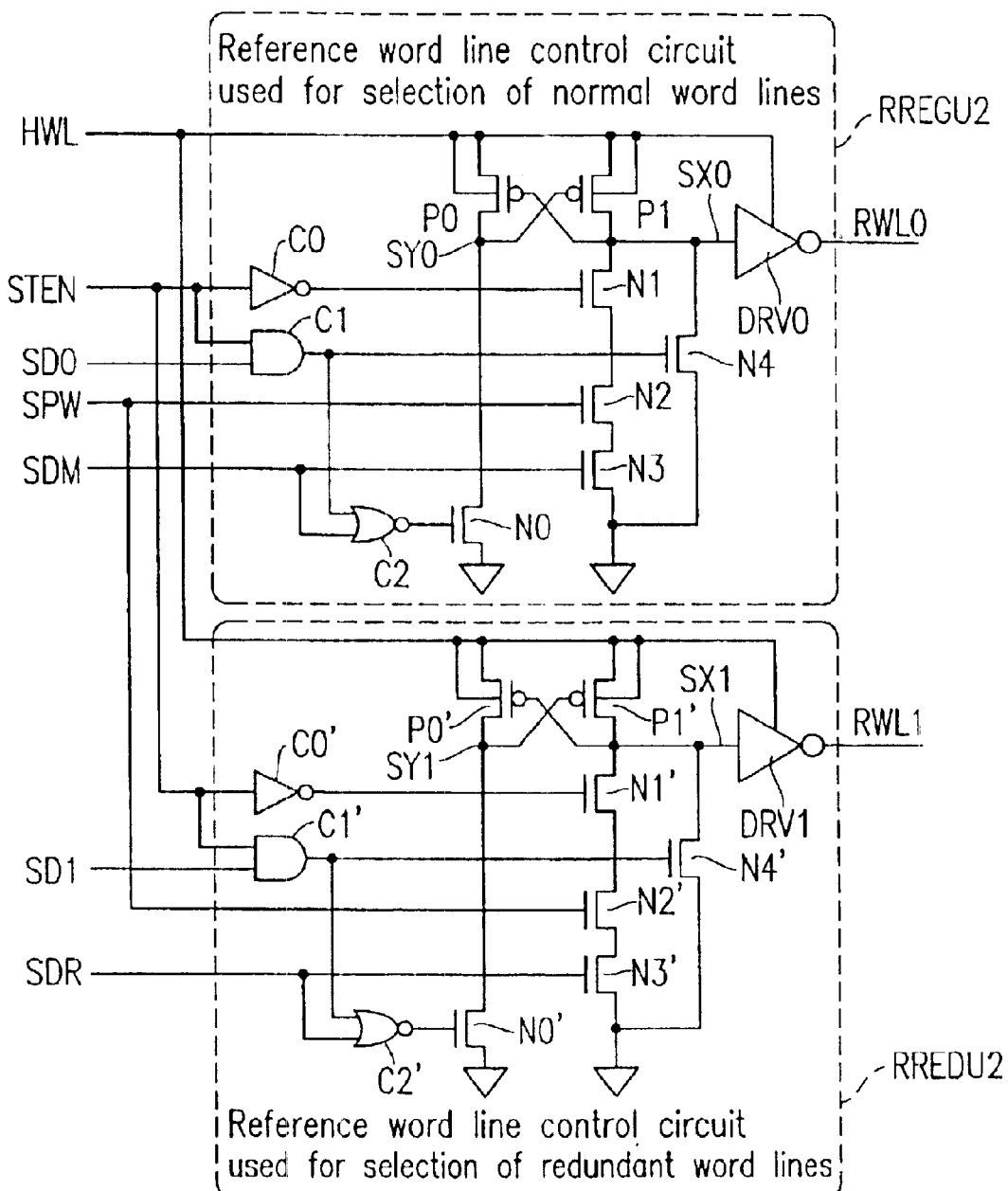
FIG. 4 is a circuit diagram showing another specific example of the reference word line control circuit used for selection of normal word lines and the reference word line control circuit used for selection of redundant word lines of FIG. 2.

FIG. 4 is a circuit diagram showing another specific example (latch-type word line driver) of the reference word line control circuit RREGU and the reference word line control circuit RREDU of FIG. 2.

In FIG. 4, the upper part in the broken line box represents the reference word line control circuit RREGU2 used for selection of normal word lines, and the lower part in the broken line box represents the reference word line control circuit RREDU2 used for selection of redundant word lines.

The reference word line control circuit RREGU2 used for selection of normal word lines is formed by an inverter C0, an AND logical circuit C1, an NOR circuit C2, P-type transistors P0 and P1, N-type transistors N0–N4, and a word line drive inverter DRV0.

As in the reference word line control circuit RREGU2, the reference word line control circuit RREDU2 used for selection of redundant word lines is formed by an inverter C0', an AND logical circuit C1', an NOR circuit C2', P-type transistors P0' and P1', N-type transistors N0'–N4', and a word line drive inverter DRV1.

When all of the N-type transistors N1–N3 (or N1'–N3') are ON and the N-type transistor N0 (or N0') is OFF, or when only the N-type transistor N4 (or N4') is ON and the N-type transistor N0 (or N0') is OFF, an input node SX0 (or SX1) of the word line drive inverter DRV0 (or DRV1) is decreased to the ground level, and a node SY0 (or SY1) is increased to a high voltage HWL level for word lines, so that the potential of the reference cell word line RWL0 (or RWL1) rises. Note that reference marks in parentheses denote elements used when the reference word line control circuit RREDU2 used for selection of redundant word lines is activated.

Each of the reference word line control circuit RREGU2 used for selection of normal word lines and the reference word line control circuit RREDU2 used for selection of redundant word lines receives the node voltage HWL for word lines, the test control signal STEN, and the word line enabling ATD signal SPW. The reference word line control circuit RREGU2 used for selection of normal word lines further receives the test reference word line selection signal SD0 and the normal word line selection control signal SDM. The reference word line control circuit RREDU2 used for selection of redundant word lines further receives the test reference word line selection signal SDI and the redundant word line selection control signal SDR.

In the above structure, the test control signal STEN is zero (low level) when data is read from a memory cell. Due to the AND logical circuit C1 (or C1'), the N-type transistor N4 (or N4') is OFF regardless of the output state of the test reference word line selection signal SD0 (or SD0'). On the other hand, the N-type transistors N1 and N1' are ON due to the operation of the inverters C0 and C0'. The word line enabling ATD signal SPW is at a high level (supply voltage level) when data is read from a memory cell, and therefore, both the N-type transistors N2 and N2' are ON.

When the memory array normal word line MWL is selected, the normal word line selection control signal SDM is at high level, and therefore, the N-type transistor N3 is ON. Accordingly, the node SX0 is decreased to the ground level, and the P-type transistor P0 is turned ON, whereby the node SY0 is increased to a high voltage HWL level for word lines, and the P-type transistor P1 is turned OFF. Since the normal word line selection control signal SDM is at high level, the N-type transistor N0 is OFF due to the operation of the NOR circuit C2. Thus, the node SY0 is not decreased to the ground level, and therefore, a through current is not produced. On the other hand, when the node SX0 is at the ground level, a selection signal is output from the word line drive inverter DRV0 to the reference cell word line RWL0, whereby the potential of the reference cell word line RWL0 rises.

Alternatively, when the memory array redundant word line ReWL is selected, the node SX1 is decreased to the ground level for the same reason as described above, and a selection signal is output from the word line drive inverter DRV1 to the reference cell word line RWL1, whereby the potential of the reference cell word line RWL1 rises.

In a test mode, i.e., in the case where the reference cell RC0 (or RC1) is manually and enforcedly accessed, the test control signal STEN is 1 (high level). Thus, the N-type transistors N1 and N1' are OFF due to the operation of the inverters C0 and C0'. Therefore, control cannot be exerted over reading of data regardless of the output states of the word line enabling ATD signal SPW, the normal word line selection control signal SDM, and the redundant word line selection control signal SDR.

In the test mode, the test reference word line selection signals SD0 and SD1 transition according to the input address signal ADD. When the test reference word line selection signal SD0 is 1, the N-type transistor N4 is turned ON so that the node SX0 is decreased to the ground level. As a result, the P-type transistor P0 is turned ON, and the P-type transistor P1 is turned OFF for the same reason as described above. In this case, since the test reference word line selection signal SD0 is 1 (high level), the N-type transistor N0 is OFF due to the operation of the AND logical circuit C1 and the NOR circuit C2. As a result of such a series of operation, the potential of the reference cell word line RWL0 rises. Alternatively, when the test reference word line selection signal SD1 is 1 (high level), the N-type transistor N4' is turned ON while the N-type transistor N0' is turned OFF, and the P-type transistor P0' is turned ON while the P-type transistor P11 is turned OFF. As a result, the node SX1 is decreased to the ground level, and the potential of the reference word line RWL1 rises.

It should be herein noted that, when the latch-type word line driver of FIG. 4 is used, it is necessary to maintain the normal word line selection control signal SDM and the redundant word line selection control signal SDR at the ground level during test mode control (when the test control signal STEN is 1). Otherwise, the test reference word line selection signals SD0 and SD1 may not be appropriately controlled. As a result, both the reference cell word lines RWL0 and RWL1 may be simultaneously selected. As a matter of course, it is not necessary to provide a special arrangement so long as the circuitry is designed such that both the normal word line selection control signal SDM and the redundant word line selection control signal SDR are at a low level when the test control signal STEN is 1.

As described above, the circuitry including two reference cell word lines RWL0 and RWL1 can readily be controlled with a simple circuit structure and without depending on the type of a word line driver. Further, even if the number of reference cell word lines is 3 or more, a control circuit of the present invention can be implemented by extending the above-described circuit structure example. The above-described circuit structures illustrated in FIGS. 3 and 4 are merely examples of the present invention. According to the present invention, any circuit structure may be employed so long as the above-described features of the circuit which are necessary for implementing the present invention are provided.

Next, the normal word line selection signal transition detection circuit XREGS and the redundant word line selection signal transition detection circuit XREDS of FIG. 2, and a method of selecting among a memory array normal word line (or a memory array redundant word line) and a reference cell word line for reading data from a memory cell, are described in detail with reference to FIG. 5.

Figure 5:
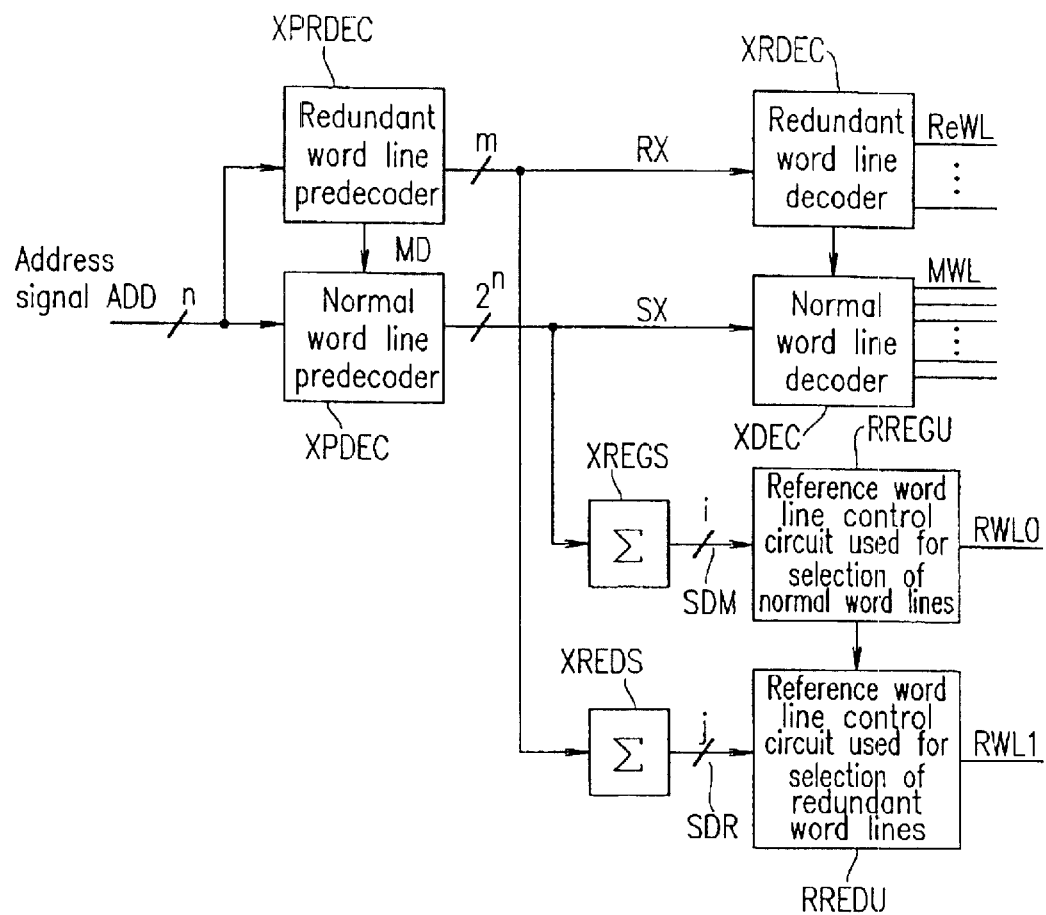
FIG. 5 is a block diagram showing a primary part of a memory array word line control circuit and a reference array word line control circuit of the non-volatile semiconductor storage device of FIG. 2.

FIG. 5 is a block diagram showing a primary part of a memory array/reference array word line control circuit of the non-volatile semiconductor storage device of FIG. 2.

Prior to description of the normal word line selection signal transition detection circuit XREGS, an operation of selecting the memory array normal word line MWL is described in more detail. In the example illustrated in FIG. 5, assume that the number of address signal lines for selecting the memory array normal word line MWL is n (where n is a natural number). In response to an address signal ADD, the normal word line predecoder XPDEC transmits a normal word line selection signal SX to the normal word line decoder XDEC through a group of $2^n$ normal word line selection signal lines. The normal word line decoder XDEC raises the potential of a desired main memory normal word line MWL based on the normal word line selection signal SX.

When at least one of the $2^n$ normal word line selection signal lines transmitting the normal word line selection signal SX transitions to a high voltage level, the normal word line selection signal transition detection circuit XREGS detects this transition so as to output the normal word line selection control signal SDM to the reference word line control circuit RREGU which is used for selecting normal word lines. The normal word line selection control signal SDM indicates whether any one of the memory array normal word lines MWL is selected. In response to this trigger signal SDM, the reference word line control circuit RREGU raises the potential of the reference cell word line RWL0. The number of signal lines, i (where i is a natural number), included in the signal line group for transmitting the normal word line selection control signal SDM may be smaller than the number of signal lines, $2^n$, included in the signal line group for transmitting the normal word line selection signal SX.

In this embodiment, the normal word line selection control signal SDM which indicates selection of the memory array normal word lines MWL is input from the normal word line selection signal transition detection circuit XREGS to the reference word line control circuit RREGU, whereby the reference word line control circuit RREGU raises the potential of the reference cell word line RWL0. However, the present invention is not limited to such a structure. For example, without providing the normal word line selection signal transition detection circuit XREGS, the normal word line selection signal SX may be directly input to the reference word line control circuit RREGU through a signal line group including $2^n$ signal lines, whereby the reference word line control circuit RREGU raises the potential of the reference cell word line RWL0.

In the case where the reference cell word line RWL0 is selected using the normal word line selection signal transition detection circuit XREGS, the signal line group for transmitting the normal word line selection signal SX may include only one signal line or a plurality of signal lines in consideration of the structure and layout area of the reference word line control circuit RREGU. As a matter of course, the number of signal lines can be considerably reduced when the normal word line selection signal transition detection circuit XREGS is provided, as compared with when the normal word line selection signal SX is directly input to the reference word line control circuit RREGU through a signal line group including $2^n$ signal lines without providing the normal word line selection signal transition detection circuit XREGS.

Prior to description of the redundant word line selection signal transition detection circuit XREDS, an operation of selecting the main memory redundant word line ReWL is described in more detail. As shown in FIG. 5, the address signal ADD used for selection of word lines is also input to the redundant word line predecoder XPRDEC. The redundant word line predecoder XPRDEC outputs a redundant word line selection signal RX to the redundant word line decoder XRDEC, and further outputs a redundancy determination signal MD, which indicates whether or not a normal word line is to be replaced with a redundant word line, to the normal word line predecoder XPDEC. In the example illustrated in FIG. 5, assume that the number of signal lines included in a signal line group for transmitting the redundant word line selection signal RX is m (where m is a natural number). The number "m" is equal to the number of redundant word lines. This signal line group is connected to the redundant word line decoder XRDEC. The redundant word line decoder XRDEC raises the potential of a desired memory array redundant word line ReWL based on the redundant word line selection signal RX transmitted through the above signal line group.

When at least one of the m signal lines for transmitting the redundant word line selection signal RX transitions to a high voltage level, the redundant word line selection signal transition detection circuit XREDS detects this transition so as to output the redundant word line selection control signal SDR to the reference word line control circuit RREDU which is used for selecting redundant word lines. The redundant word line selection control signal SDR indicates that any of the memory array redundant word lines ReWL is selected. In response to this trigger signal SDR, the reference word line control circuit RREDU raises the potential of the reference cell word line RWL1. The number of signal lines, j (where j is a natural number), included in the signal line group for transmitting the redundant word line selection control signal SDR may be smaller than the number of signal lines, m, included in the signal line group for transmitting the redundant word line selection signal RX.

In this embodiment, the redundant word line selection control signal SDR which indicates selection of the memory array redundant word lines ReWL is input from the redundant word line selection signal transition detection circuit XREDS to the reference word line control circuit RREDU, whereby the reference word line control circuit RREDU raises the potential of the reference cell word line RWL1. However, the present invention is not limited to such a structure. For example, without providing the redundant word line selection signal transition detection circuit XREDS, the redundant word line selection signal RX may be directly input to the reference word line control circuit RREDU through a signal line group including m signal lines, whereby the reference word line control circuit RREDU raises the potential of the reference cell word line RWL1.

In the case where the reference cell word line RWL1 is selected using the redundant word line selection signal transition detection circuit XREDS, the signal line group for transmitting the redundant word line selection signal RX may include only one signal line or a plurality of signal lines in consideration of the structure and layout area of the reference word line control circuit RREDU. As a matter of course, the number of signal lines can be considerably reduced when the redundant word line selection signal transition detection circuit XREDS is provided, as compared with when the redundant word line selection signal RX is directly input to the reference word line control circuit RREDU through a signal line group including m signal lines without providing the redundant word line selection signal transition detection circuit XREDS.

As described above, the normal word line selection signal transition detection circuit XREGS detects a transition of the normal word line selection signal SX and then outputs the normal word line selection control signal SDM to the reference word line control circuit RREGU which is used for selection of normal word lines. Thus, when the normal word line selection signal transition detection circuit XREGS is provided, there is a concern that the output timing of the normal word line selection control signal SDM is delayed with respect to that of the normal word line selection signal SX, and accordingly, a time difference is caused between the rising times of the potential of the reference cell word line RWL0 and the potential of the memory array normal word line MWL. However, in an actual device, since a large number of memory cells MC0 are connected to the normal word lines, the wire capacitance (gate capacitance) of the normal word lines almost dominates the rising transition of the potential of the normal word lines. Thus, a delay of the normal word line selection control signal SDM caused by the normal word line selection signal transition detection circuit XREGS rarely causes a difference between rise timings of the potentials of the reference cell word line RWL0 and the memory array normal word line MWL.

As described above, the redundant word line selection signal transition detection circuit XREDS detects a transition of the redundant word line selection signal RX and then outputs the redundant word line selection control signal SDR to the reference word line control circuit RREDU which is used for selection of redundant word lines. Thus, when the redundant word line selection signal transition detection circuit XREDS is provided, the output timing of the redundant word line selection control signal SDR is delayed with respect to that of the redundant word line selection signal RX. However, in this case also, due to the wire capacitance of the redundant word lines and the memory cells MC1, a delay of the redundant word line selection control signal SDR caused by the redundant word line selection signal transition detection circuit XREDS rarely causes a difference between rise timings of the potentials of the reference cell word line RWL1 and the memory array redundant word line ReWL.

An operation of the above structure is now described. Specifically, a data read operation performed when a non-redundant normal word line MWL is selected is described with reference to the timing chart of FIG. 6.

Figure 6:
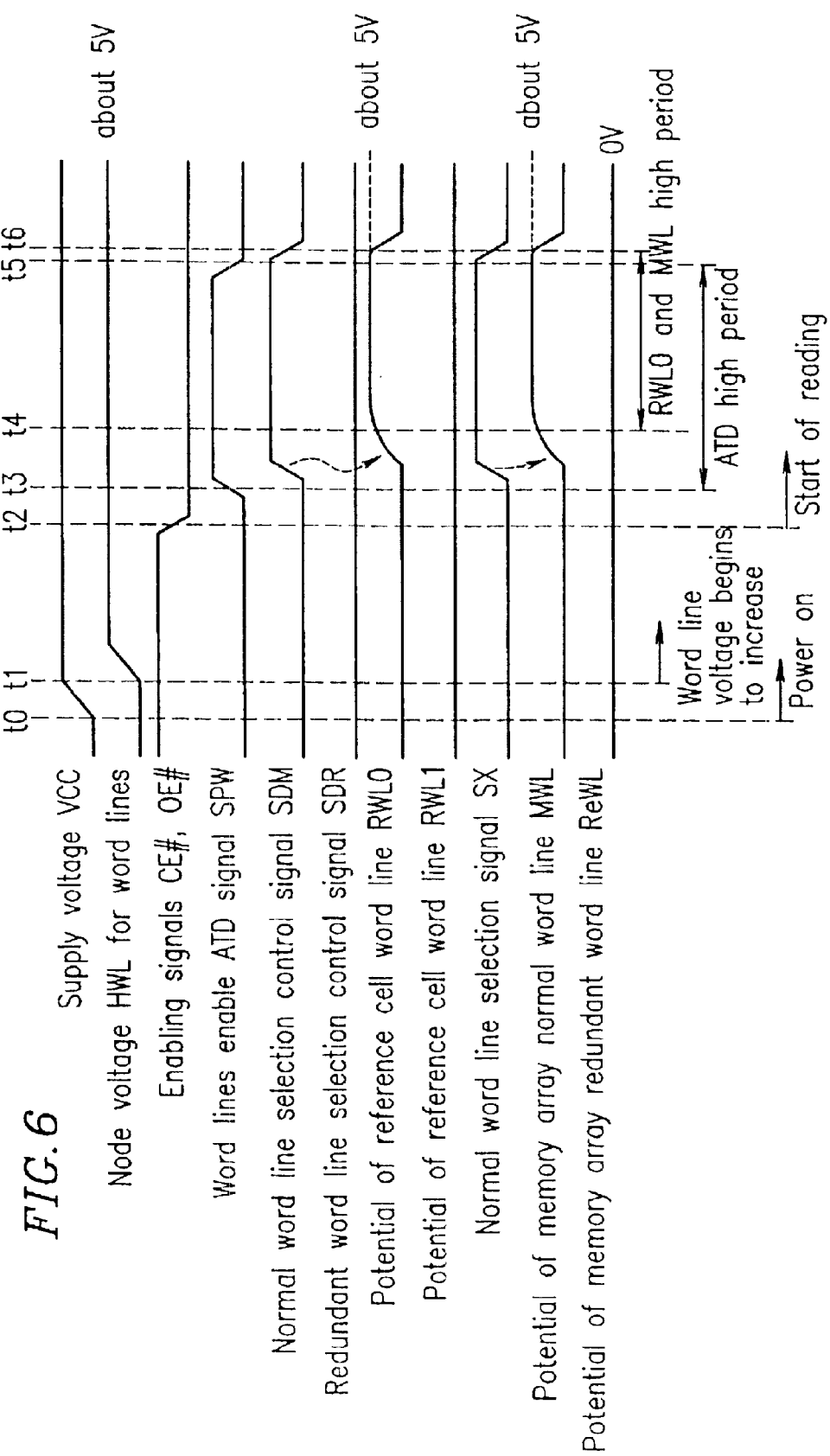
FIG. 6 is a timing chart illustrating a word line selection operation when a normal word line is selected in the non-volatile semiconductor storage device of FIG. 2.

In FIG. 6, the horizontal axis represents time (t0 to t6), and the vertical axis represents the voltage level of each signal. FIG. 6 shows, from the top to the bottom of FIG. 6, supply voltage VCC; the node voltage HWL for word lines; a chip enabling signal CE# which is a control signal for activating the storage device; an output enabling signal OE# which is a control signal for permitting data output; the word line enable ATD signal SPW which is output from an address transition detection circuit ATD; the normal word line selection control signal SDM; the redundant word line selection control signal SDR; the potential of the reference cell word line RWL0; the potential of the reference cell word line RWL1; the normal word line selection signal SX; the potential of the memory array normal word line MWL; and the potential of the memory array redundant word line ReWL. When both the chip enabling signal CE# and the output enabling signal OE# are at the ground level, a data read operation can be performed.

Referring to FIG. 6, after the storage device 30 is powered on at time t0, the node voltage HWL for word lines, which is used for reading of data, begins to rise at time t1.

At time t2 which occurs immediately after the storage device 30 is powered on, the non-volatile semiconductor storage device 30, such as a flash EEPROM, is in a data readable state. That is, in this state, data can be read out from the storage device 30 by decreasing the chip enabling signal CE# to the ground level.

Then, at time t3, the word line enable ATD signal SPW rises in response to falling of the chip enabling signal CE#. In response to the rising of the word line enable ATD signal SPW, the normal word line predecoder XPDEC raises the normal word line selection signal SX and outputs this raised signal SX to the normal word line decoder XDEC and the normal word line selection signal transition detection circuit XREGS.

At time t4, in response to the rising of the normal word line selection signal SX, the normal word line decoder XDEC begins to raise the potential of the predetermined memory array normal word line MWL.

On the other hand, the normal word line selection signal transition detection circuit XREGS detects a transition of the normal word line selection signal SX (high level voltage), and then outputs the normal word line selection control signal SDM to the reference word line control circuit RREGU which is used for selection of normal word lines. The reference word line control circuit RREGU detects that the normal word line selection control signal SDM reaches the supply voltage level, and begins to raise the potential of a predetermined reference cell word line RWL0. As described above, the operation time of the normal word line selection signal transition detection circuit XREGS is compensated for by the wire capacitance of the word lines to some extent, and therefore, the rise timing of the predetermined potential of the reference cell word line RWL0 and the rise timing of the predetermined memory array normal word line MWL occur at substantially the same time.

After a while, reading of data is completed, and then, the word line enable ATD signal SPW falls to a low level at time t5. As a result, both the reference cell word line RWL0 and the potential of the predetermined memory array normal word line MWL falls to the ground level at time t6.

In this way, the potential of the reference cell word line RWL0 is raised in response to a trigger signal, i.e., the normal word line selection signal SX which is used for selecting the memory array normal word line MWL or the normal word line selection control signal SDM which indicates selection of the memory array normal word lines MWL, whereby a difference in the rise timings of both the potential of the reference cell word line RWL0 and the potential of the memory array normal word line MWL can be eliminated as much as possible to a negligible level, while the load capacitances of the reference cell word line RWL0 and the memory array normal word line MWL become equal to each other. Thus, the possibility that the sense amplifier S/A commits erroneous reading is considerably reduced even at the start of a data read operation. Furthermore, if the possibility of erroneous reading is considerably reduced, the timing of the start of a data read operation occurs earlier, and as a result, the data read speed can be further increased without causing erroneous reading of data.

Figure 7:
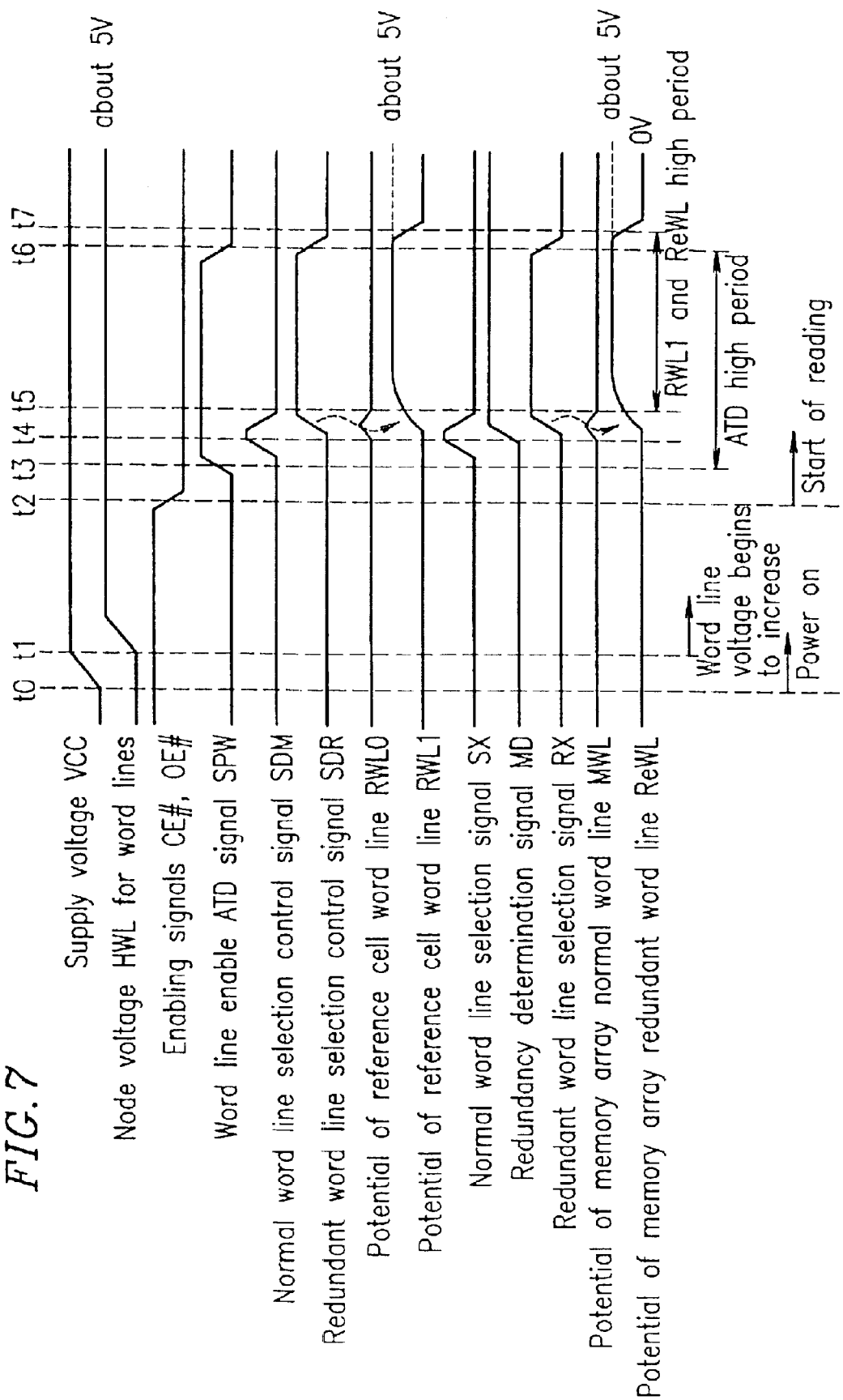
FIG. 7 is a timing chart illustrating a word line selection operation when a redundant word line is selected in the non-volatile semiconductor storage device of FIG. 2.
Figure 8:
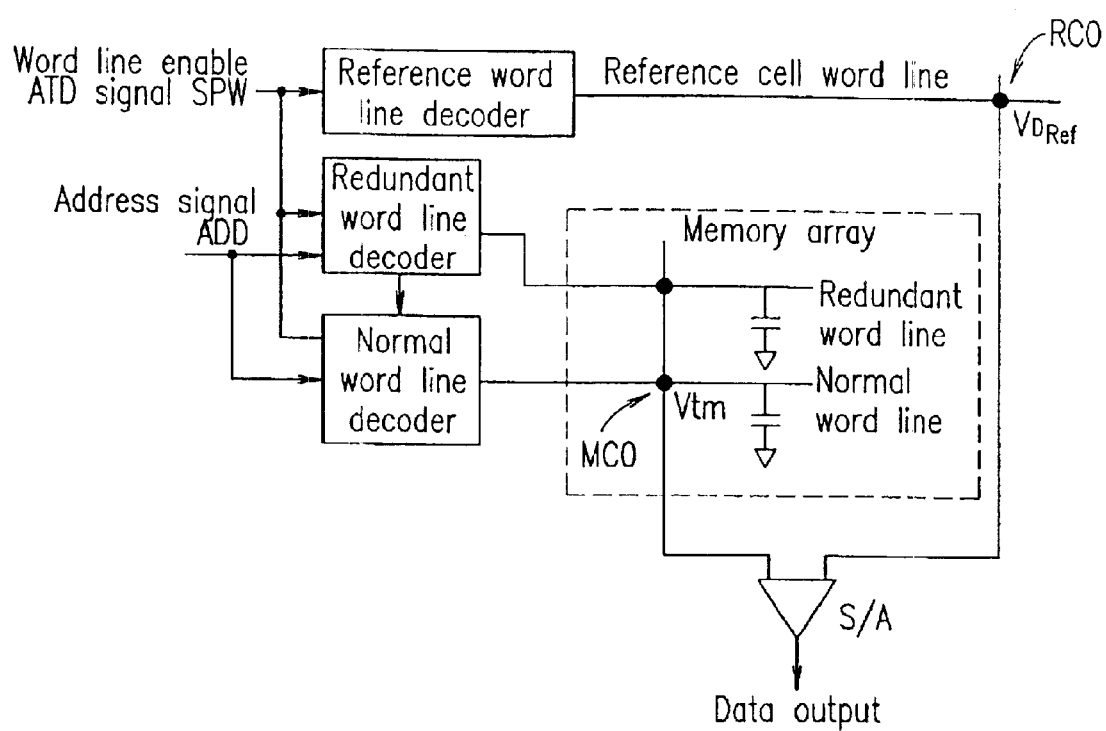
FIG. 8 is a block diagram showing an exemplary basic structure of a conventional non-volatile semiconductor storage device.
Figure 9:
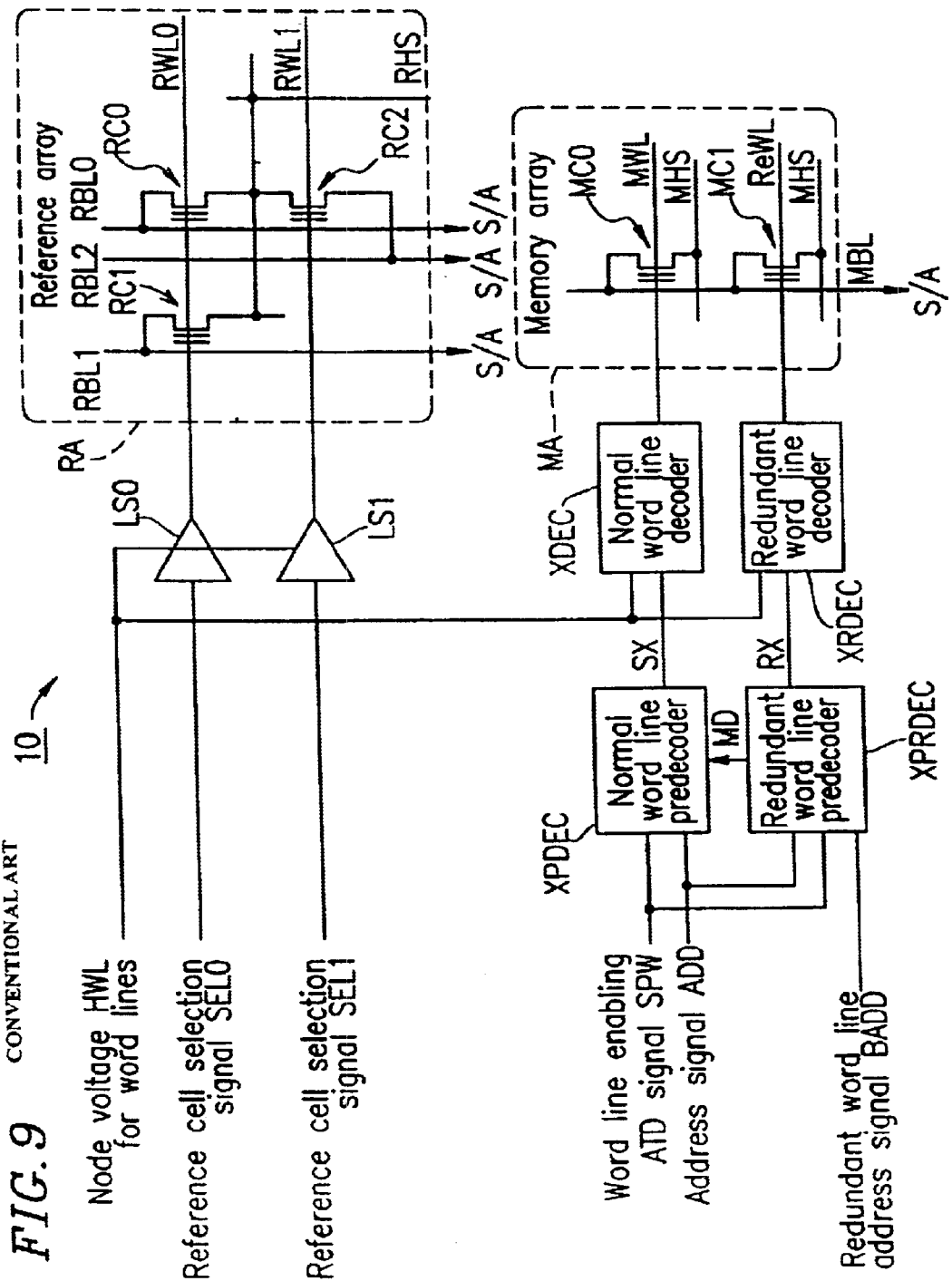
FIG. 9 is a block diagram showing an exemplary specific structure of a conventional non-volatile semiconductor storage device.
Figure 10:
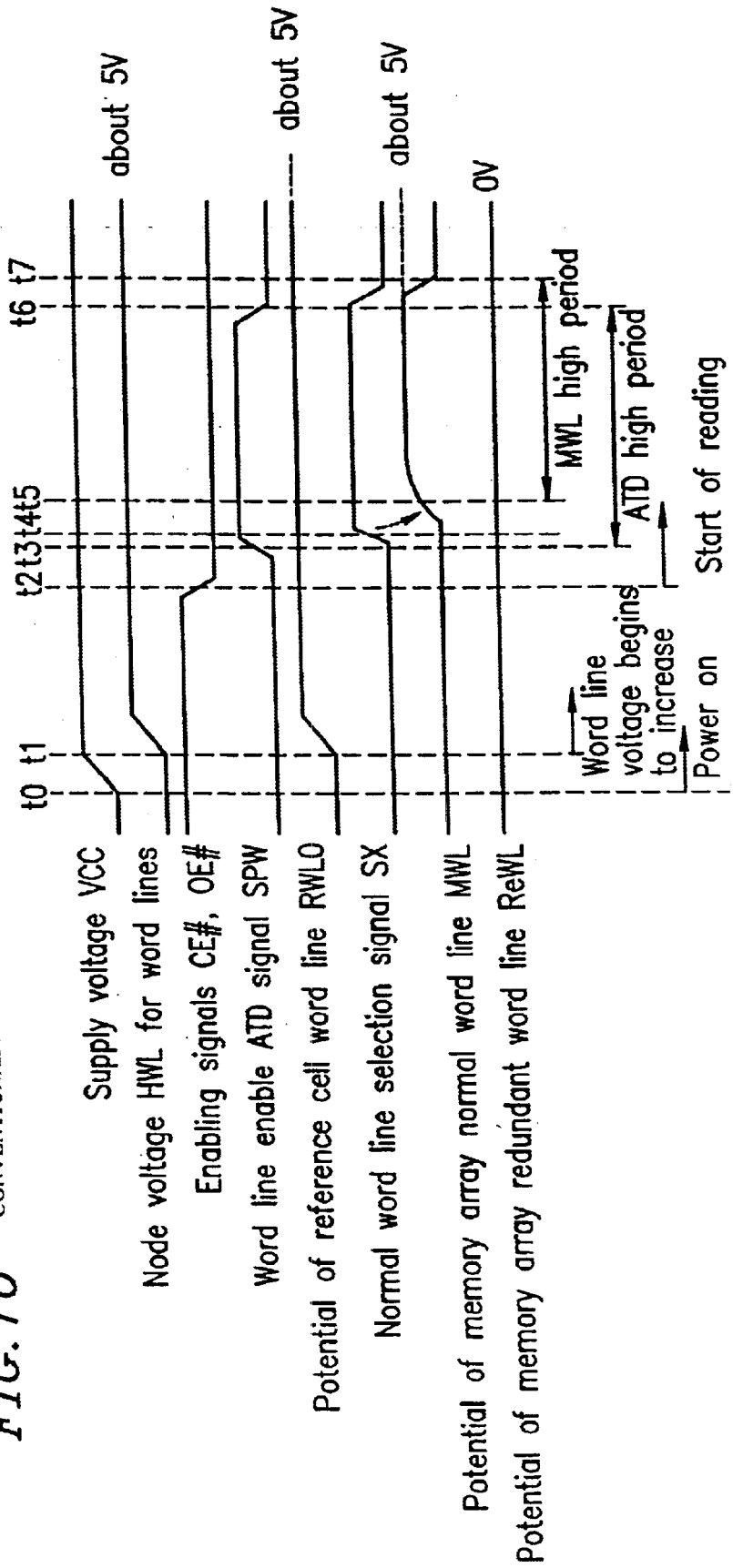
FIG. 10 is a timing chart illustrating a word line selection operation when a non-redundant, memory array normal word line is selected in the non-volatile semiconductor storage device of FIG. 9.
Figure 11:
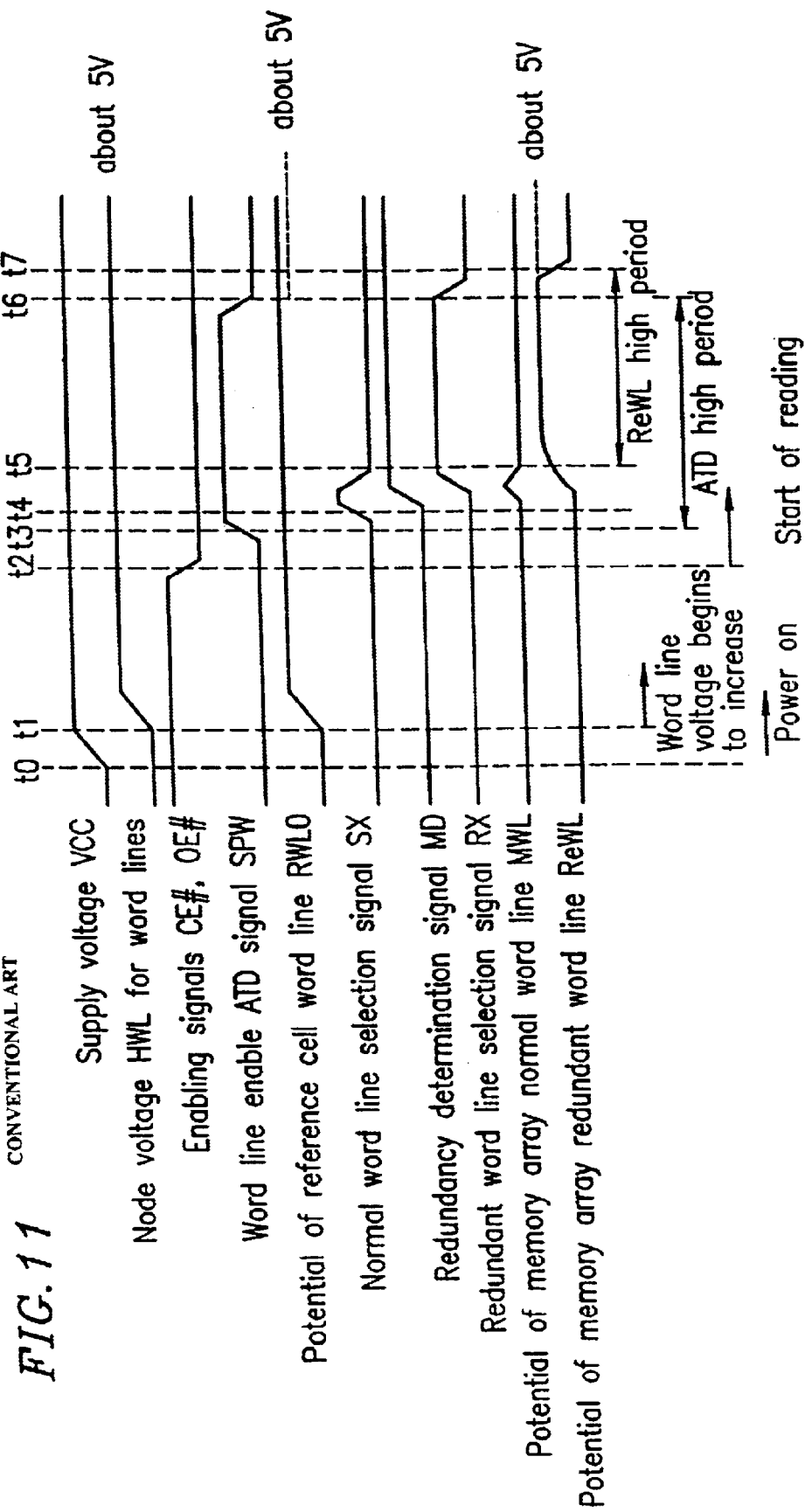
FIG. 11 is a timing chart illustrating a word line selection operation when a redundant word line is selected in the non-volatile semiconductor storage device of FIG. 9.
Figure 12:
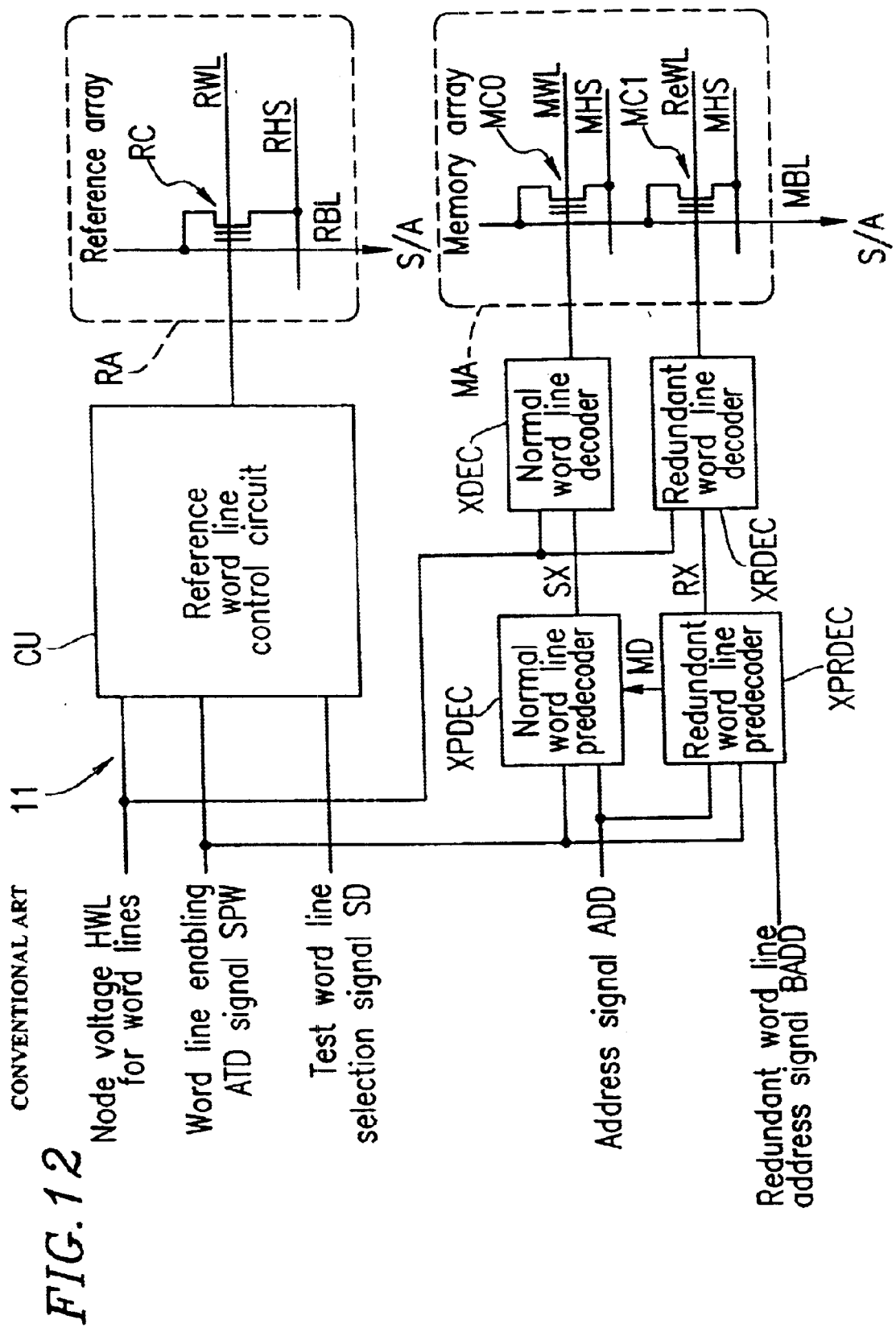
FIG. 12 is a block diagram showing another exemplary specific structure of a conventional non-volatile semiconductor storage device.
Figure 13:
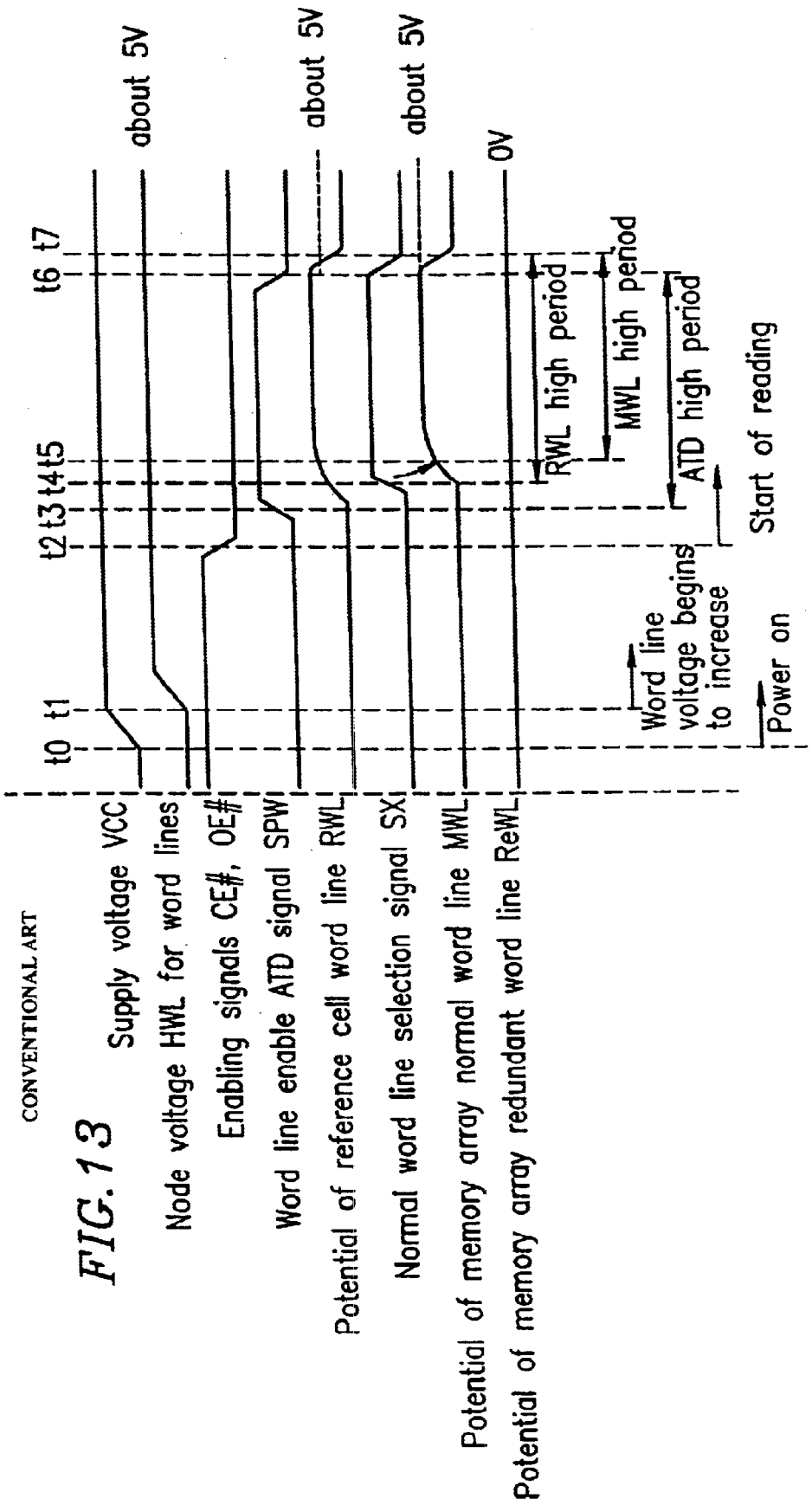
FIG. 13 is a timing chart illustrating a word line selection operation when a non-redundant, memory array normal word line is selected in the non-volatile semiconductor storage device of FIG. 12.
Figure 14:
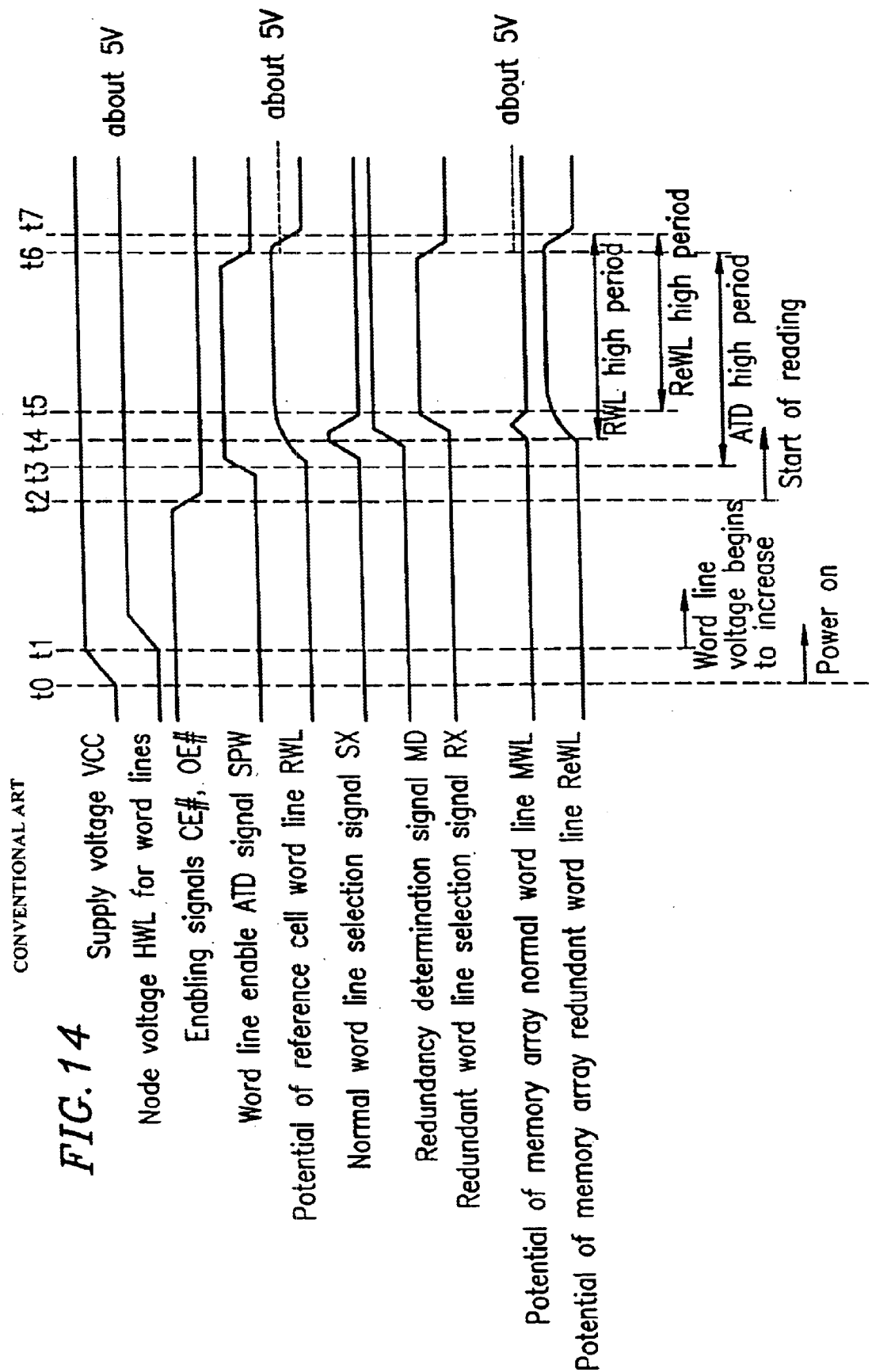
FIG. 14 is a timing chart illustrating a word line selection operation when a redundant word line is selected in the non-volatile semiconductor storage device of FIG. 12.
Figure 15:
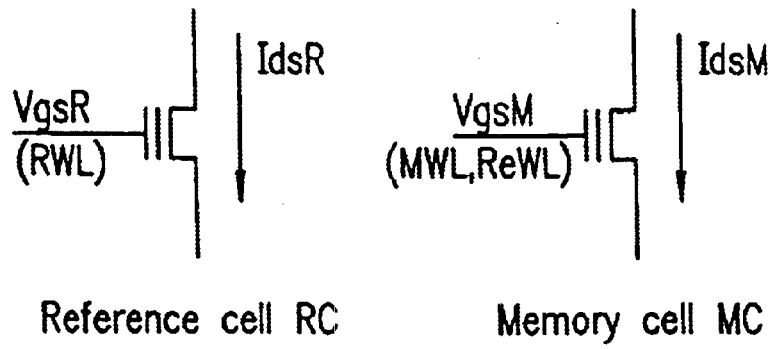
FIG. 15 shows the control voltage and driving current in each of a reference cell and a memory cell during a data read operation.
Figure 16:
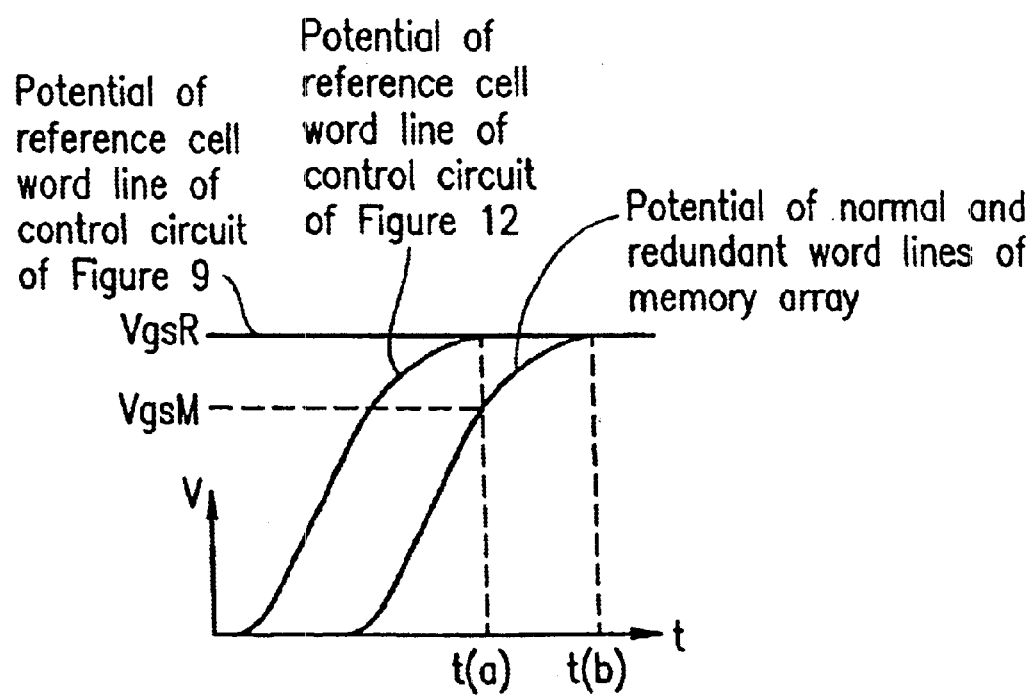
FIG. 16 illustrates a sensing timing with respect to the rising of the potential of a reference cell word line and the potential of a memory array normal word line (or a memory array redundant word line).

Next, a data read operation performed when a redundant word line is selected is described with reference to the timing chart of FIG. 7. In FIG. 7, a redundancy determination signal MD and a redundant word line selection signal RX are considered in addition to the various signals described above, and a redundant word line is considered in place of the memory array normal word line MWL. The operation from time t0 through time t3 is totally the same as that described in FIG. 6, and therefore, the description thereof is herein omitted. The following description begins with time t4.

After a while since the word line enable ATD signal SPW has risen, the normal word line selection signal SX rises to the supply voltage level at time t4. The normal word line selection signal transition detection circuit XREGS detects the transition of the normal word line selection signal SX (high level voltage) so as to raise the normal word line selection control signal SDM. In response to this operation, both the reference cell word line RWL0 and the memory array normal word line MWL begin to rise.

However, immediately after that, the redundancy determination signal MD is output from the redundant word line predecoder XPRDEC to the normal word line predecoder XPDEC at time t4. Both the normal word line selection signal SX and the normal word line selection control signal SDM which indicates selection of a normal word line decrease to a low level. As a result, the reference cell word line RWL0 and the potential of the memory array normal word line MWL transition to the ground level.

In this way, in response to the issuance of the redundancy determination signal MD, the redundant word line predecoder XPRDEC outputs the redundant word line selection signal RX to the redundant word line decoder XRDEC and the redundant word line selection signal transition detection circuit XREDS.

Then, the redundant word line selection signal transition detection circuit XREDS detects a transition of the redundant word line selection signal RX (high level voltage) and outputs the redundant word line selection control signal SDR to the reference word line control circuit RREDU.

At time t5, the reference word line control circuit RREDU begins to raise the potential of the reference cell word line RWL1 in response to the rising of the redundant word line selection control signal SDR. At the same time, the redundant word line decoder XRDEC begins to raise the potential of the predetermined memory array redundant word line ReWL in response to the rising of the redundant word line selection signal RX.

In this example, after the potential of the memory array normal word line MWL began to rise, the memory array normal word line MWL is canceled and switched to the predetermined memory array redundant word line ReWL.

This is because, as described above, the normal word line predecoder XPDEC undesirably issues the normal word line selection signal SX while the redundant word line predecoder XPRDEC is considering whether the predetermined memory array normal word line MWL is switched to the predetermined memory array redundant word line ReWL based on the address signal ADD, and accordingly, a certain length of time is required for canceling the normal word line selection signal SX by the redundancy determination signal MD.

After a while, reading of data is completed, and then, the word line enable ATD signal SPW falls to a low level at time t6. In response to the falling of the word line enable ATD signal SPW, both the reference cell word line RWL1 and the memory array redundant word line ReWL fall to the ground level at time t7.

As described above in conjunction with the conventional art, in a conventional memory device, when it is necessary to replace the predetermined memory array normal word line MWL selected based on an input address signal with the memory array redundant word line ReWL, the normal word line selection signal SX is generally canceled after a redundancy determination process is completed, and thereafter, selection of redundant word lines is performed. Thus, the rise timing of the potential of the memory array redundant word line ReWL is inevitably delayed with respect to the rise timing of the potential of the predetermined memory array normal word line MWL. Therefore, in the case of using a conventional reference word line control method, a considerable time difference is produced between the rise timing of the potential of the reference cell word line RWL and the rise timing of the potential of the memory array redundant word line ReWL.

According to the present invention, however, a delay time produced by replacement of the memory array normal word line MWL with the memory array redundant word line ReWL is compensated for by performing similar replacement in the reference array RA among a plurality of reference cell word lines RWL (in the above example, two reference cell word lines RWL0 and RWL1). That is, a selection determination section formed by the normal word line predecoder XPDEC and the redundant word line predecoder XPRDEC determines which of the memory array normal word line MWL and the memory array redundant word line ReWL is to be selected based on address information. After the determination, the normal word line decoder XDEC (or the redundant word line decoder XRDEC) selects the memory array normal word line MWL (or the memory array redundant word line ReWL), and at the same time, the reference word line control circuit RREGU which is used for selection of normal word lines (or the reference word line control circuit RREDU which is used for selection of redundant word lines) selects the reference cell word lines RWL0 (or RWL1). Thus, even when the memory array redundant word line ReWL is selected, the data read time can be reduced without deteriorating the sensing ability of the sense amplifier S/A.

As described above, according to this embodiment of the present invention, the potential of the reference cell word lines RWL0 (or RWL1) and the potential of the memory array normal word line MWL (or the memory array redundant word line ReWL) are raised in a synchronous manner. Thus, even if the sensing timing of the sense amplifier S/A is set to occur prior to the rise timing of the word lines by the address transition detection circuit ATD, high speed reading of data can be achieved without causing an erroneous operation. Furthermore, due to such an arrangement, a considerable sensing margin can be obtained for achieving secure data reading.

Although not specifically described in the above embodiment, a semiconductor storage device of this embodiment can be readily incorporated in an information apparatus, represented by a cellular telephone terminal or a PDA (personal digital assistant), and in such an information apparatus, a high-speed data reading effect of the present invention can be obtained. For example, in the case of a cellular telephone terminal, character information and image information used in an e-mail system, or the like, can be transmitted/received as well as sound information. These information are stored in a non-volatile semiconductor storage device, such as a flash memory, and moreover, the amount of such information to be processed has been increasing along with the development of functions of cellular telephone terminals. Accordingly, there is a growing demand for further increasing the speed of processing such information. Specifically, for example, a reduction of the time required for reading data to be compressed/decompressed for transmission, a reduction of the time required for reading control codes, such as a program used for such data compression/decompression, a reduction of the time required for executing the data compression/decompression, or the like, have been demanded. A semiconductor storage device of the present invention can be readily incorporated in an information and control code storage section, and satisfy the above-described demands for high-speed information processing.

Figure 18:
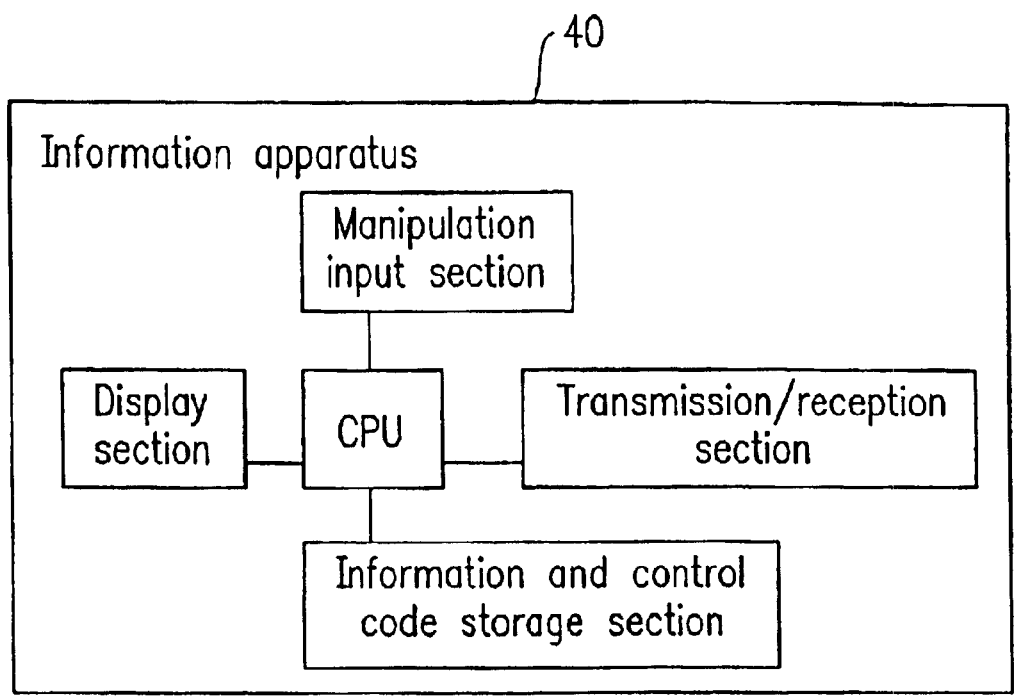
FIG. 18 is a block diagram showing a basic structure of an information apparatus including a semiconductor storage device of the present invention.

For example, consider an information apparatus 40 having a structure shown in FIG. 18, such as a cellular telephone terminal. The information apparatus 40 includes: an information and control code storage section; a manipulation input section, such as manipulation keys or the like; a display section for displaying an initial image, results of information processing, or the like, such as a liquid crystal display device; a transmission/reception section for transmitting/receiving information; and a CPU (central processing unit) for performing read/write processing (memory operation) on the information and control code storage section in response to an input manipulation instruction from the manipulation input section based on a predetermined information processing program and relevant data when certain information is transmitted or received, while performing various information processing. A semiconductor storage device of the present invention can readily be employed as the information and control code storage section, and in such a case, a high-speed data read effect of the present invention can be achieved in the information apparatus 40.

As described above, according to the present invention, the potential of a word line of a reference cell and the potential of a word line of a memory cell from which data is to be read out are raised in a synchronous manner. Even when reading of data is started before the potential of an intended word line reaches a predetermined voltage as in a conventional device, the data read speed can be increased without causing an erroneous operation. Further, due to such an improvement of the data read speed, a considerable sensing margin can be obtained for achieving secure data reading.

Furthermore, a first word line (or a second word line) of a reference array and a normal word line (or a redundant word line) of a memory array have the same load capacitance. Thus, the rise timings of these word lines are also the same, and as a result, the read access time can be further reduced without causing an erroneous operation.

Further still, a semiconductor storage device of the present invention can be readily employed in an information apparatus, and in such a case, a high-speed data read effect of the present invention can be achieved in a data read operation of the information apparatus.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor storage device, comprising:
   a memory array including a plurality of memory cells;
   a reference array including a plurality of reference cells;
   a decoder section for selecting a memory cell from the memory cells and a reference cell from the reference cells based on address information; and
   a comparison/output section for comparing a read voltage level from the memory cell selected by the decoder section and a read voltage level from the reference cell selected by the decoder section so as to output a result of the comparison in the form of data,
   wherein the decoder section simultaneously outputs a selection signal to a word line of the memory cell and a selection signal to a word line of the reference cell.

2. A semiconductor storage device according to claim 1, wherein:
   the memory array includes one or more memory cells respectively connected to a normal word line, and one or more memory cells respectively connected to a redundant word line; and
   the reference array includes a first reference cell which is compared with the memory cells connected to the normal word line, and a second reference cell which is compared with the memory cells connected to the redundant word line.

3. A semiconductor storage device according to claim 2, wherein:
   when the normal word line is selected, the decoder section selects a first word line connected to the first reference cell simultaneously with selection of the normal word line; and
   when the redundant word line is selected, the decoder section selects a second word line connected to the second reference cell simultaneously with selection of the redundant word line.

4. A semiconductor storage device according to claim 3, wherein the decoder section includes:
   a selection determination section for determining which of the normal word line and the redundant word line is to be selected based on address information;
   a normal word line control section for selecting the normal word line according to the address information when it is determined that the normal word line is to be selected;
   a redundant word line control section for selecting the redundant word line according to the address information when it is determined that the redundant word line is to be selected;
   a first reference word line control section for selecting the first word line when it is determined that the normal word line is to be selected; and
   a second reference word line control section for selecting the second word line when it is determined that the redundant word line is to be selected.

5. A semiconductor storage device according to claim 4, wherein:
   when it is determined that the normal word line is to be selected, the first reference word line control section receives a selection signal for the normal word line or a signal indicating that the normal word line is to be selected, and selects the first word line, using as a trigger, the selection signal for the normal word line or the signal indicating that the normal word line is to be selected; and
   when it is determined that the redundant word line is to be selected, the second reference word line control section receives a selection signal for the redundant word line or a signal indicating that the redundant word line is to be selected, and selects the second word line, using as a trigger, the selection signal for the redundant word line or the signal indicating that the redundant word line is to be selected.

6. A semiconductor storage device according to claim 4, wherein:
   a first test signal can be input to the first reference word line control section, and the first reference cell is enforcedly selected in response to the first test signal; and
   a second test signal can be input to the second reference word line control section, and the second reference cell is enforcedly selected in response to the second test signal.

7. A semiconductor storage device according to claim 4, wherein:
   an address transition detection signal, which is output in response to detection of a change in the address information, can be input to both the first reference word line control section and the second reference word line control section; and
   when the address transition detection signal is input, control of reference word lines can be performed.

8. A semiconductor storage device according to claim 3, wherein the first reference cell and the second reference cell are set to the same threshold value.

9. A semiconductor storage device according to claim 3, wherein the first reference cell and the second reference cell are commonly connected to the same bit line.

10. A semiconductor storage device according to claim 3, wherein the load capacitance of the first word line connected to the first reference cell and the load capacitance of the second word line connected to the second reference cell are equal to the load capacitance of the normal word line and the load capacitance of the redundant word line, respectively.

11. A semiconductor storage device according to claim 2, wherein the first reference cell and the second reference cell are set to the same threshold value.

12. A semiconductor storage device according to claim 2, wherein the first reference cell and the second reference cell are commonly connected to the same bit line.

13. A semiconductor storage device according to claim 2, wherein the load capacitance of a first word line connected to the first reference cell and the load capacitance of a second word line connected to the second reference cell are equal to the load capacitance of the normal word line and the load capacitance of the redundant word line, respectively.

14. An information apparatus for performing a data read operation using the semiconductor storage device according to claim 1.

* * * * *